United States Patent
Sim et al.

(10) Patent No.: US 11,073,541 B2
(45) Date of Patent: Jul. 27, 2021

(54) INTELLIGENT METHOD FOR CONTROLLING HOME APPLIANCE, APPARATUS AND INTELLIGENT COMPUTING DEVICE FOR CONTROLLING HOME APPLIANCE

(71) Applicant: LG Electronics Inc., Seoul (KR)

(72) Inventors: Myoseop Sim, Seoul (KR); Huijeong Seong, Seoul (KR); Dongki Cheon, Seoul (KR); Jahee Hur, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/554,814

(22) Filed: Aug. 29, 2019

(65) Prior Publication Data

US 2019/0383865 A1  Dec. 19, 2019

(30) Foreign Application Priority Data

Jul. 11, 2019  (KR) ........................ 10-2019-0084089

(51) Int. Cl.
| | |
|---|---|
| *G01R 19/25* | (2006.01) |
| *H04L 12/28* | (2006.01) |
| *G01D 4/00* | (2006.01) |
| *H04W 56/00* | (2009.01) |
| *H04W 52/02* | (2009.01) |
| *H04W 72/04* | (2009.01) |

(52) U.S. Cl.
CPC ......... *G01R 19/2513* (2013.01); *G01D 4/002* (2013.01); *H04L 12/2825* (2013.01); *H04W 52/0212* (2013.01); *H04W 56/001* (2013.01); *H04W 72/042* (2013.01); *H04L 2012/285* (2013.01)

(58) Field of Classification Search
None
See application file for complete search history.

(56) References Cited

U.S. PATENT DOCUMENTS

| | | | | |
|---|---|---|---|---|
| 7,561,977 B2 * | 7/2009 | Horst | ................ | H02J 13/00012 |
| | | | | 702/62 |
| 2016/0195856 A1 * | 7/2016 | Spero | ..................... | G05B 15/02 |
| | | | | 700/90 |

FOREIGN PATENT DOCUMENTS

| | | | | |
|---|---|---|---|---|
| KR | 20150064771 A | * | 6/2015 | |
| WO | WO-2018128410 A1 | * | 7/2018 | ........... H04L 5/0048 |

* cited by examiner

*Primary Examiner* — Roy Y Yi
(74) *Attorney, Agent, or Firm* — Fish & Richardson P.C.

(57) ABSTRACT

An intelligent home appliance control method includes obtaining power usage data of a device provided with power, generates information related to an optimal usage setting for the device, and controlling power provided to the device, thereby minimizing power usage required for using multiple home appliances at home. At least one of the home appliance control apparatus, an intelligent computing device, a terminal, a server, and an IoT device may be associated with an artificial intelligence (AI) module, a drone (an unmanned aerial vehicle (UAV)), a robot, an augmented reality (AR) device, a virtual reality (VR) device, a device related to a 5G service, or the like.

18 Claims, 13 Drawing Sheets

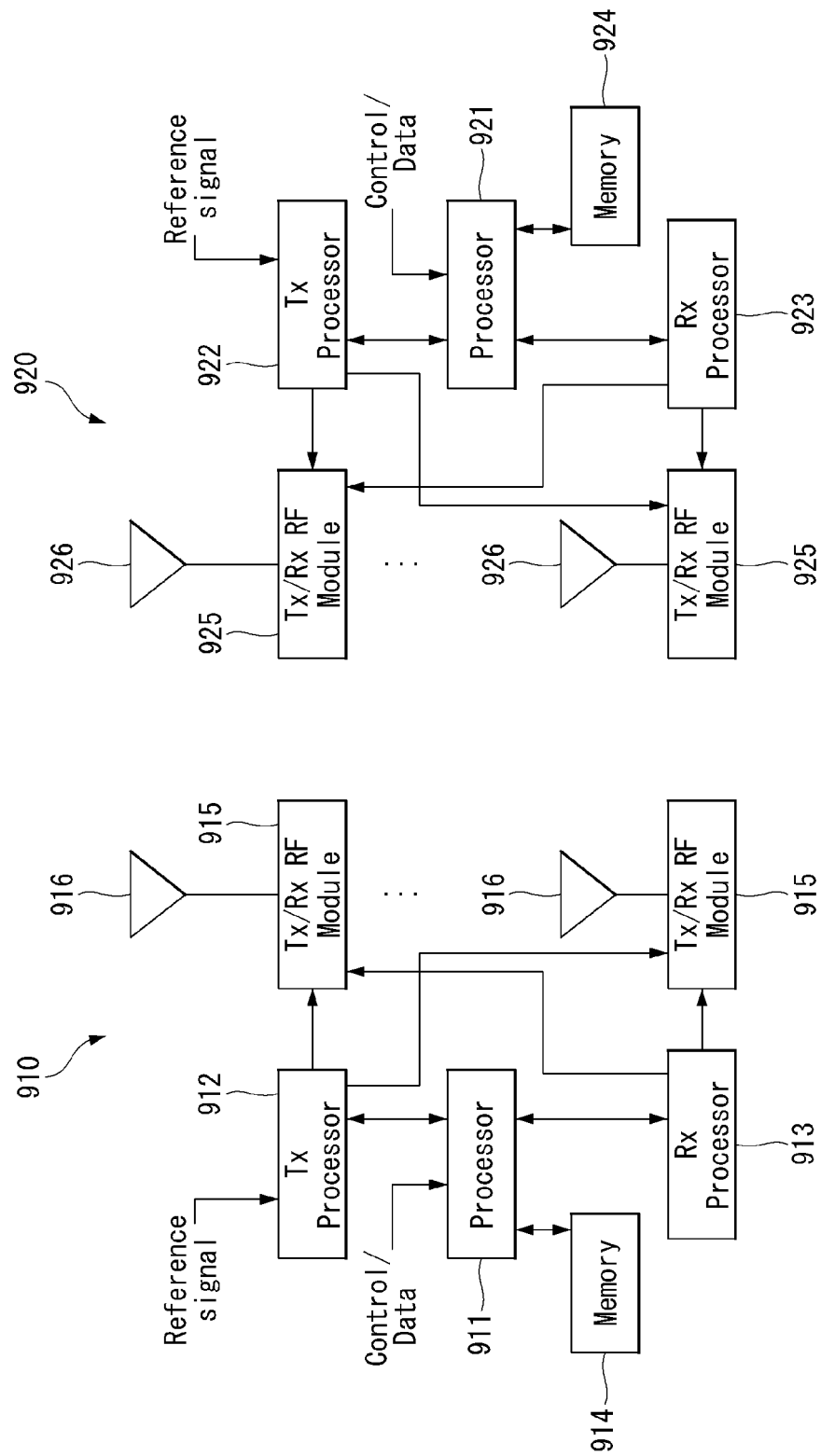
[FIG. 1]

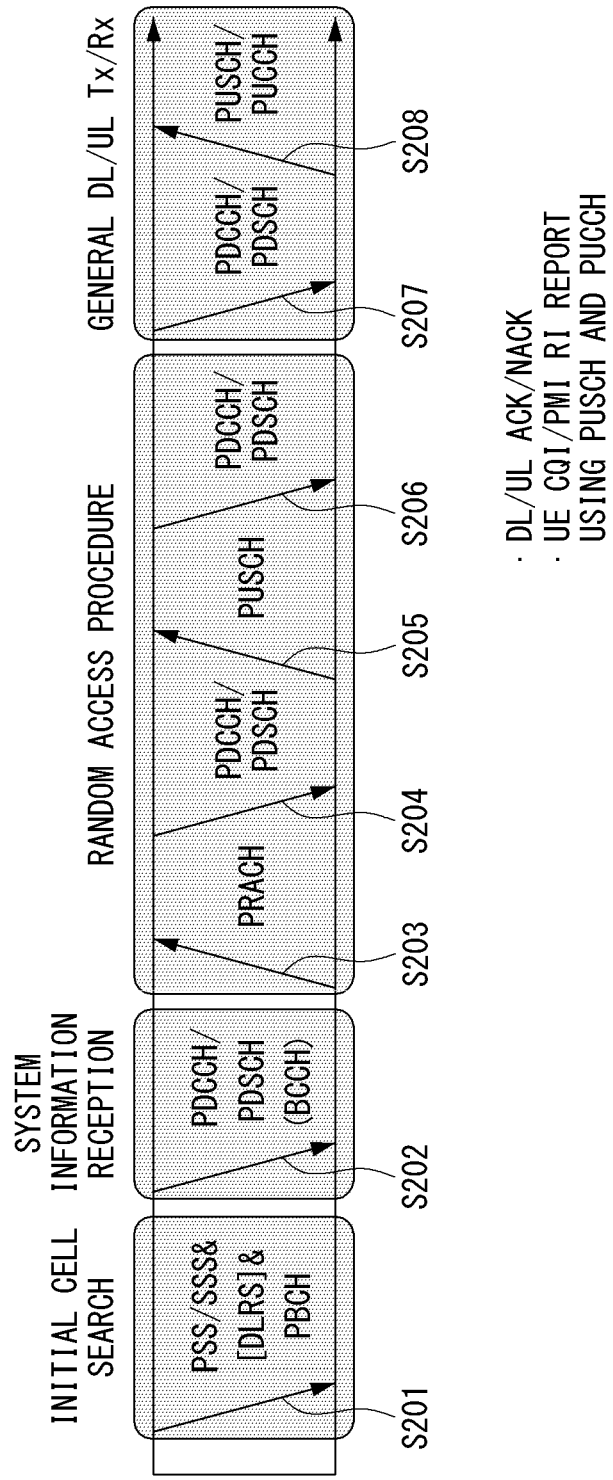
[FIG. 2]

[FIG. 3]
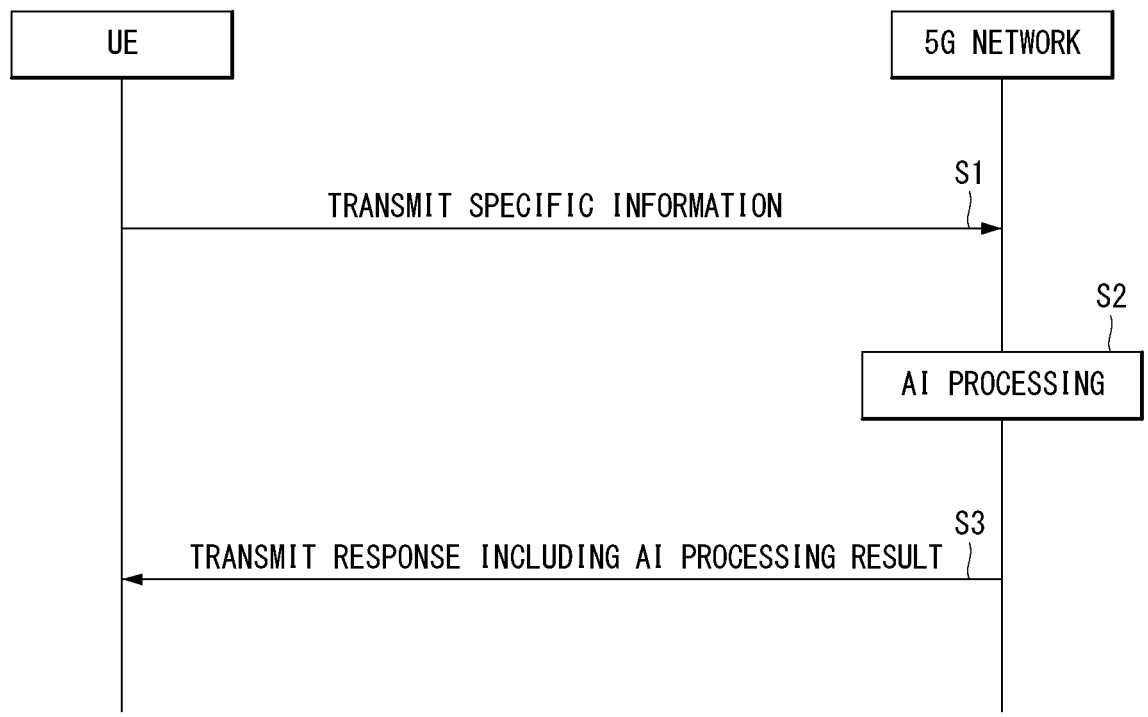

【FIG. 4】
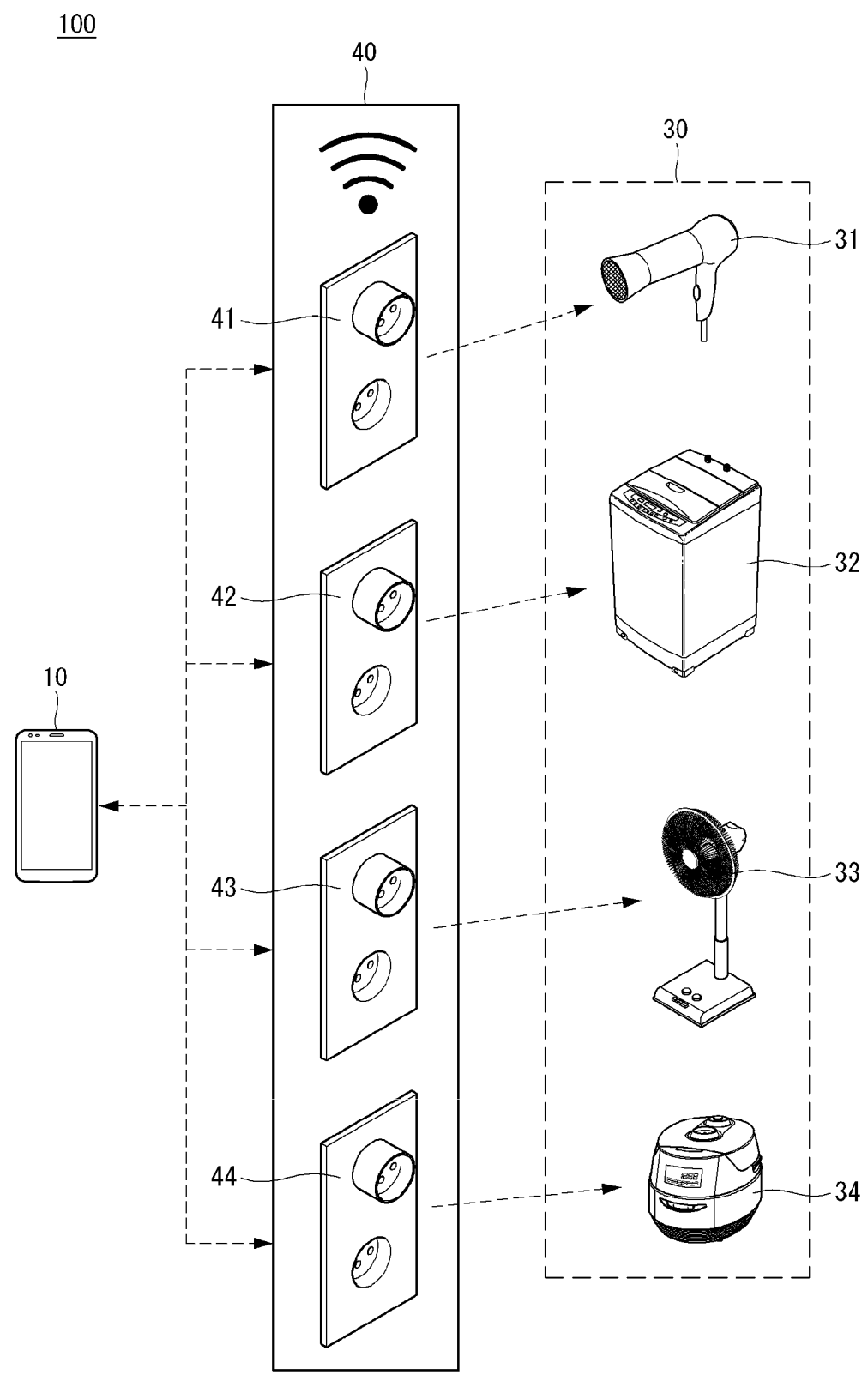

[FIG. 5]
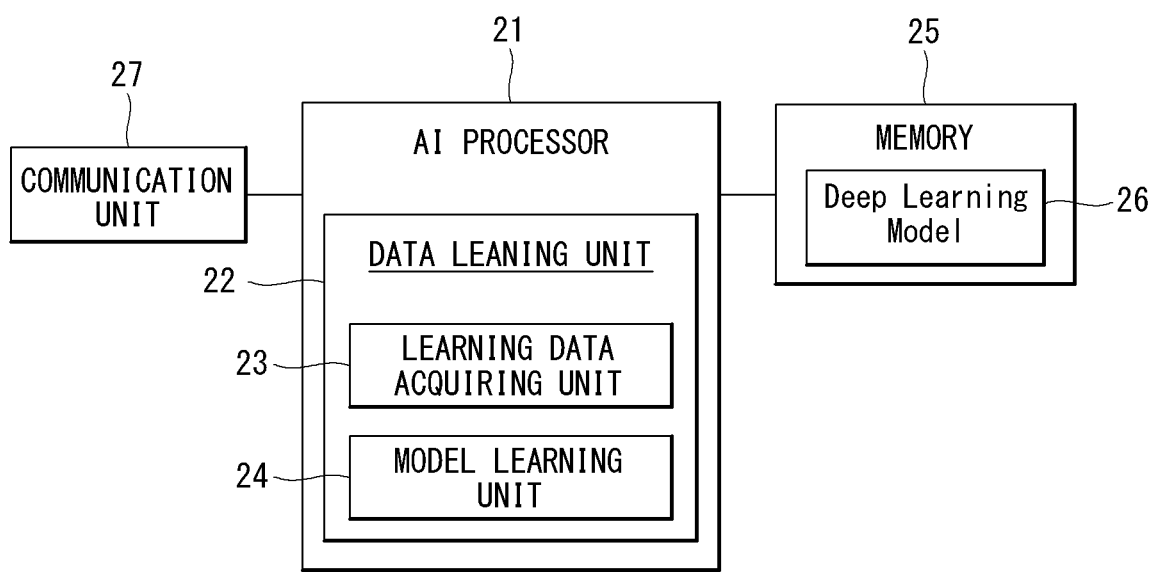

[FIG. 6]
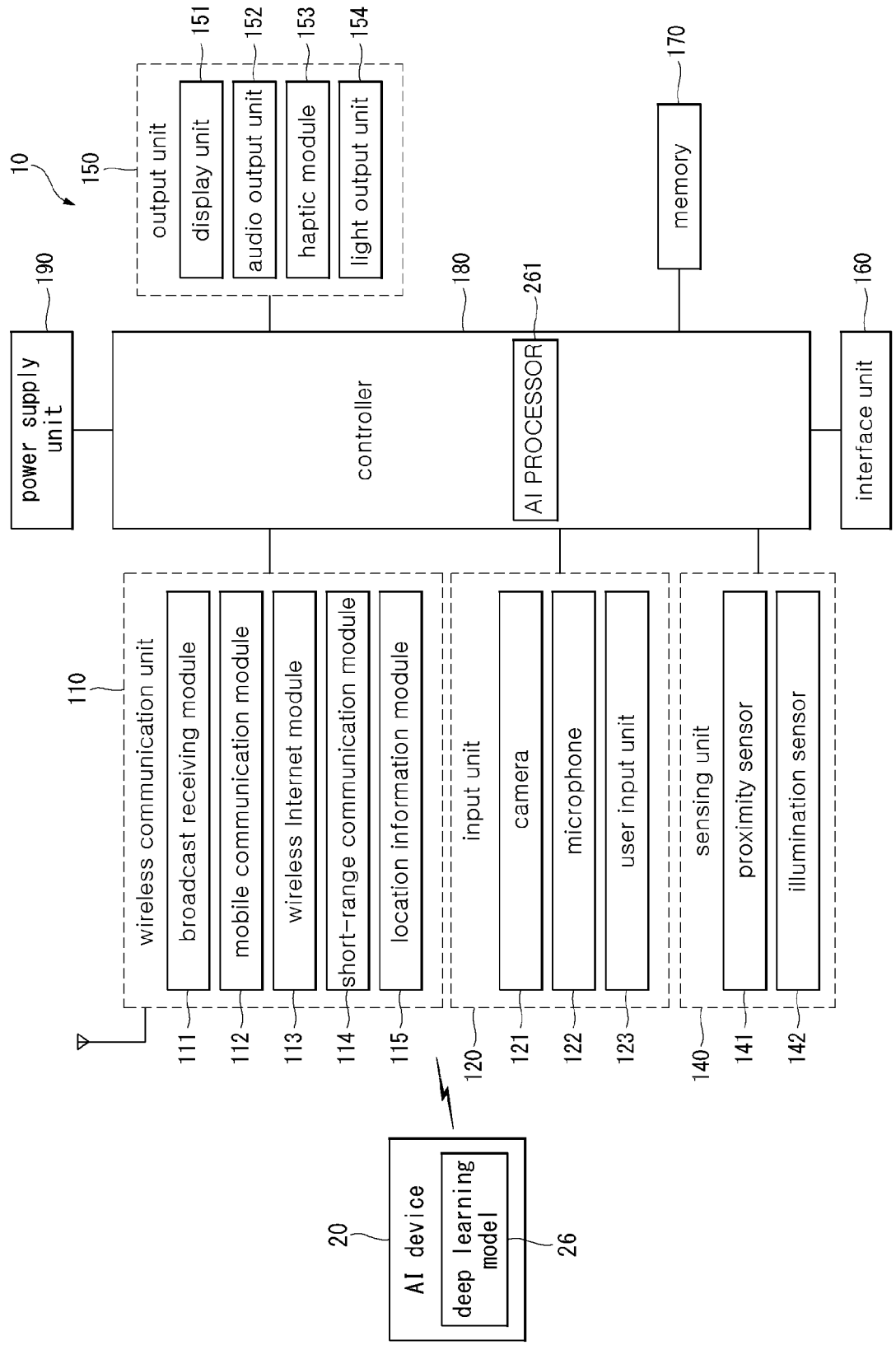

[FIG. 7]
S700
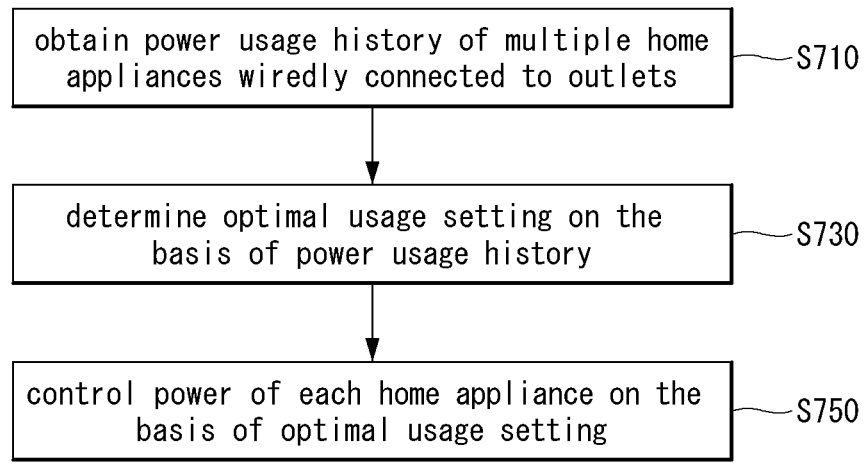
[FIG. 8]
S710
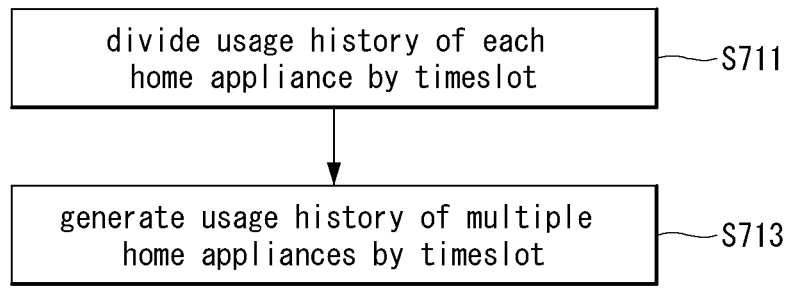

[FIG. 9]
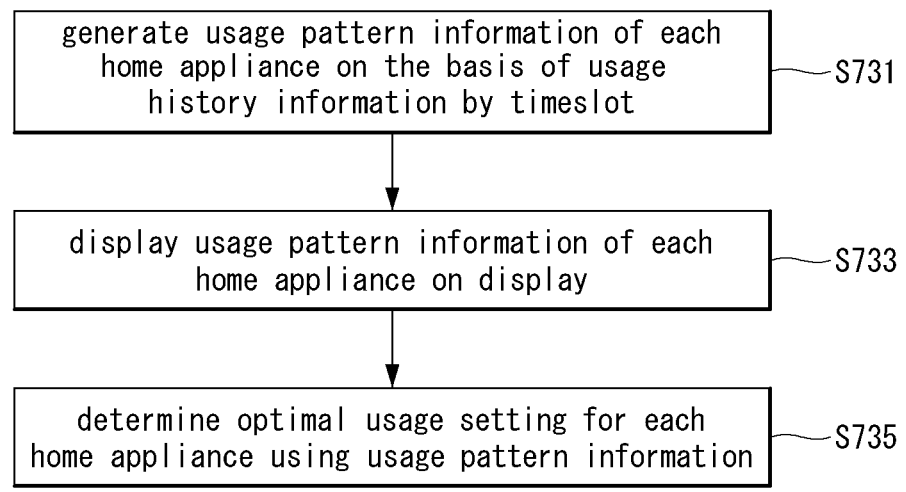

[FIG. 10]
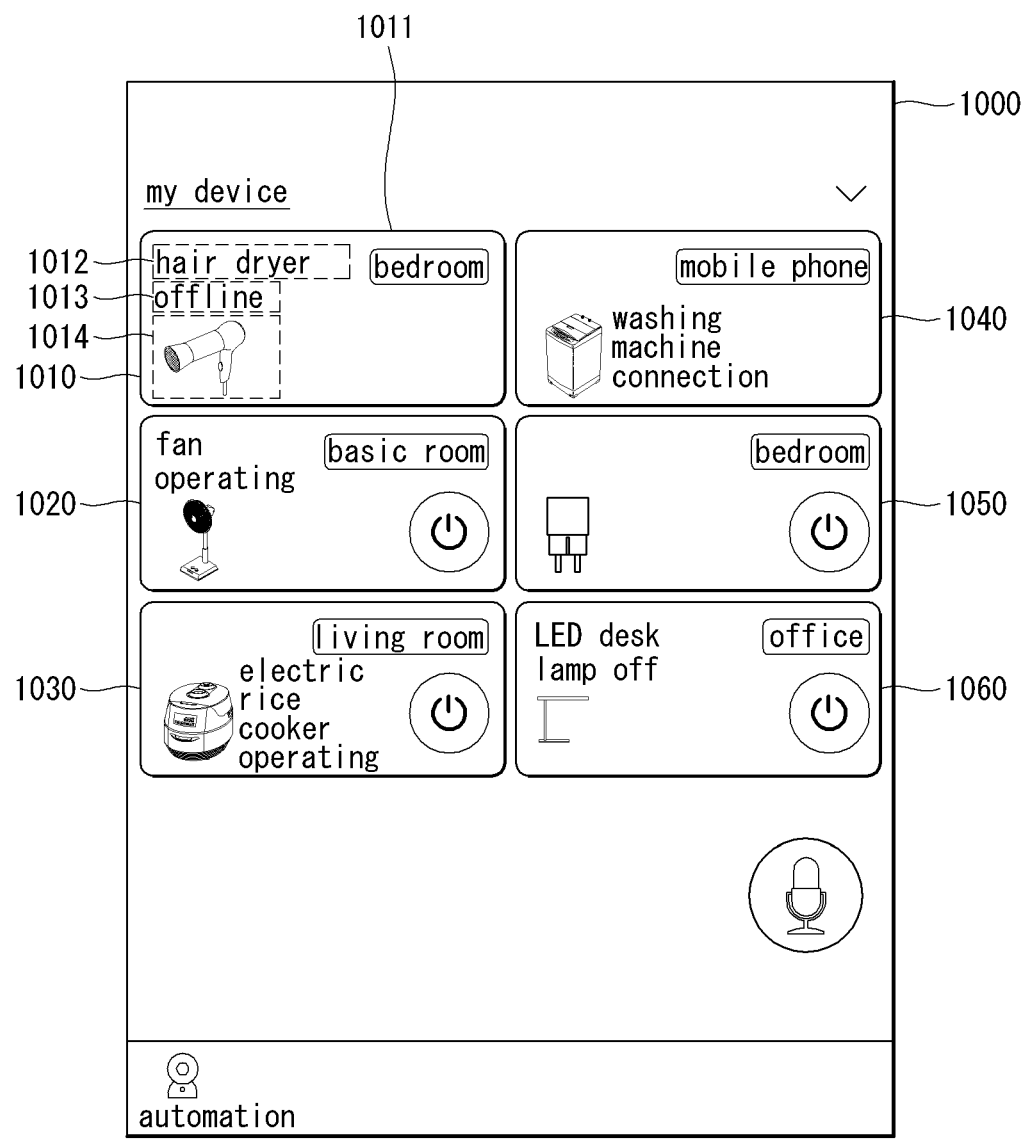

[FIG. 11]
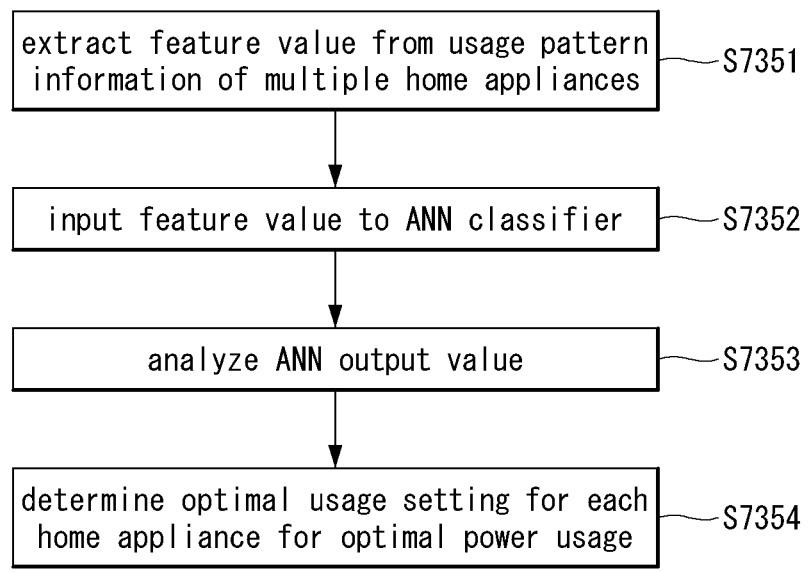

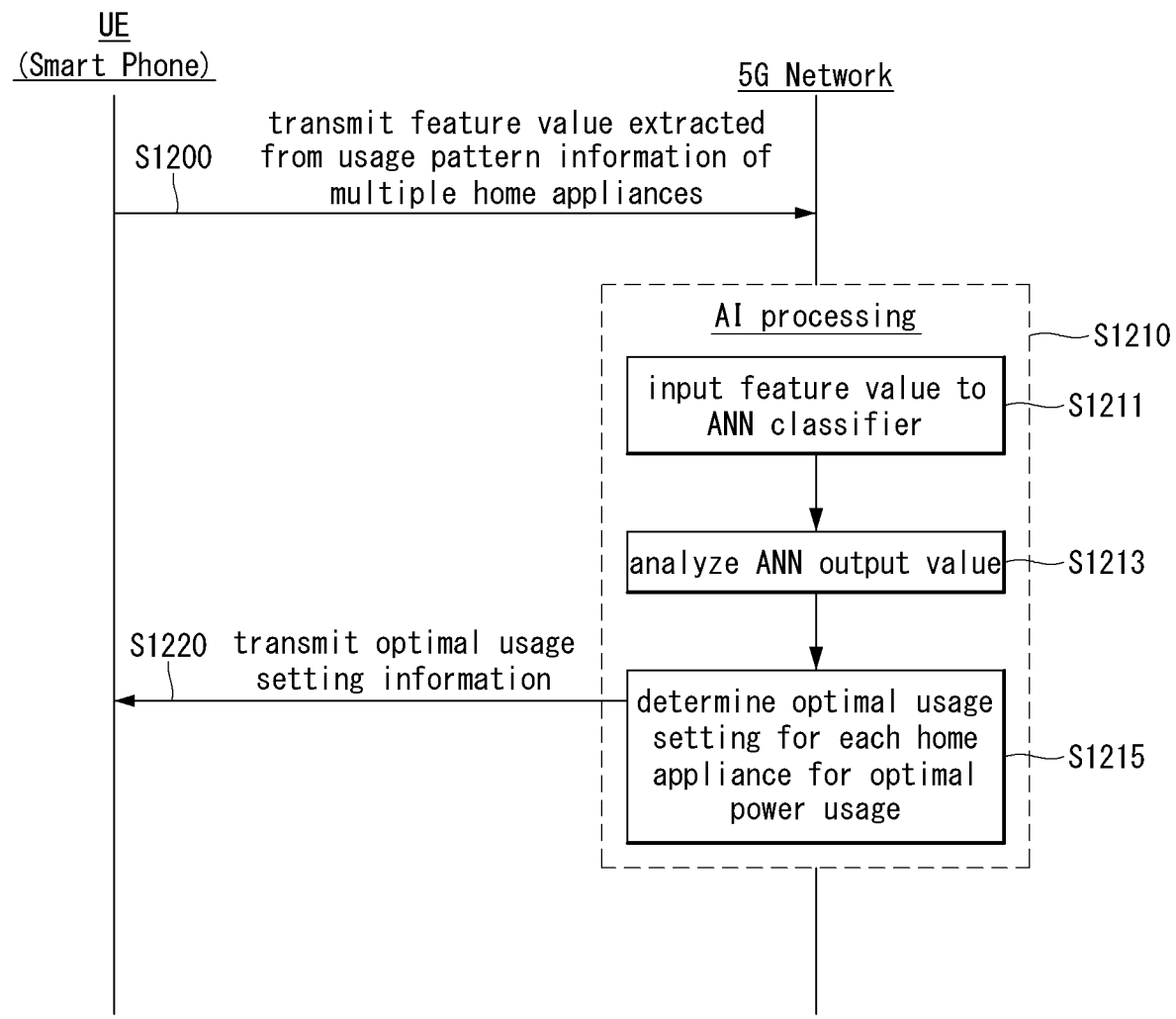
[FIG. 12]

[FIG. 13]
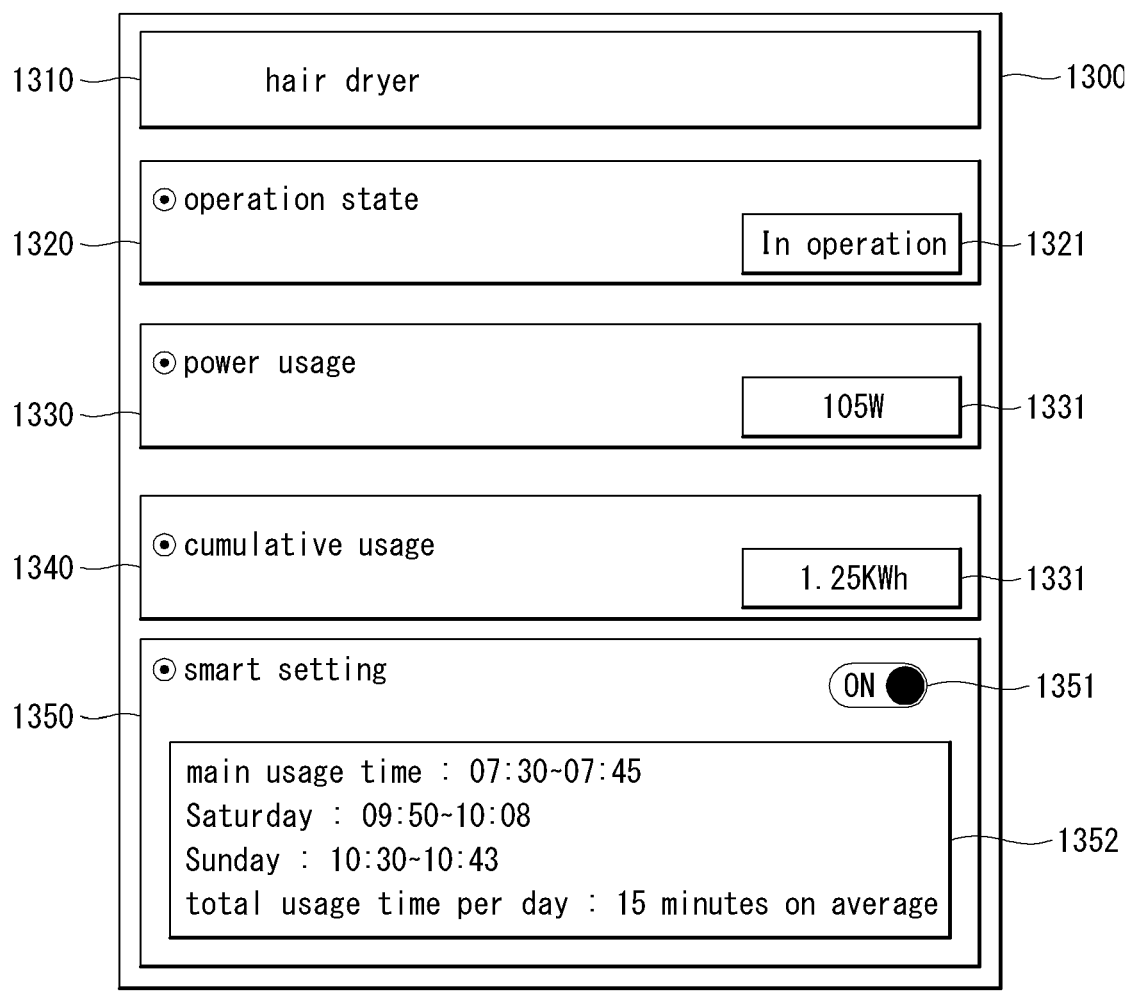

【FIG. 14】
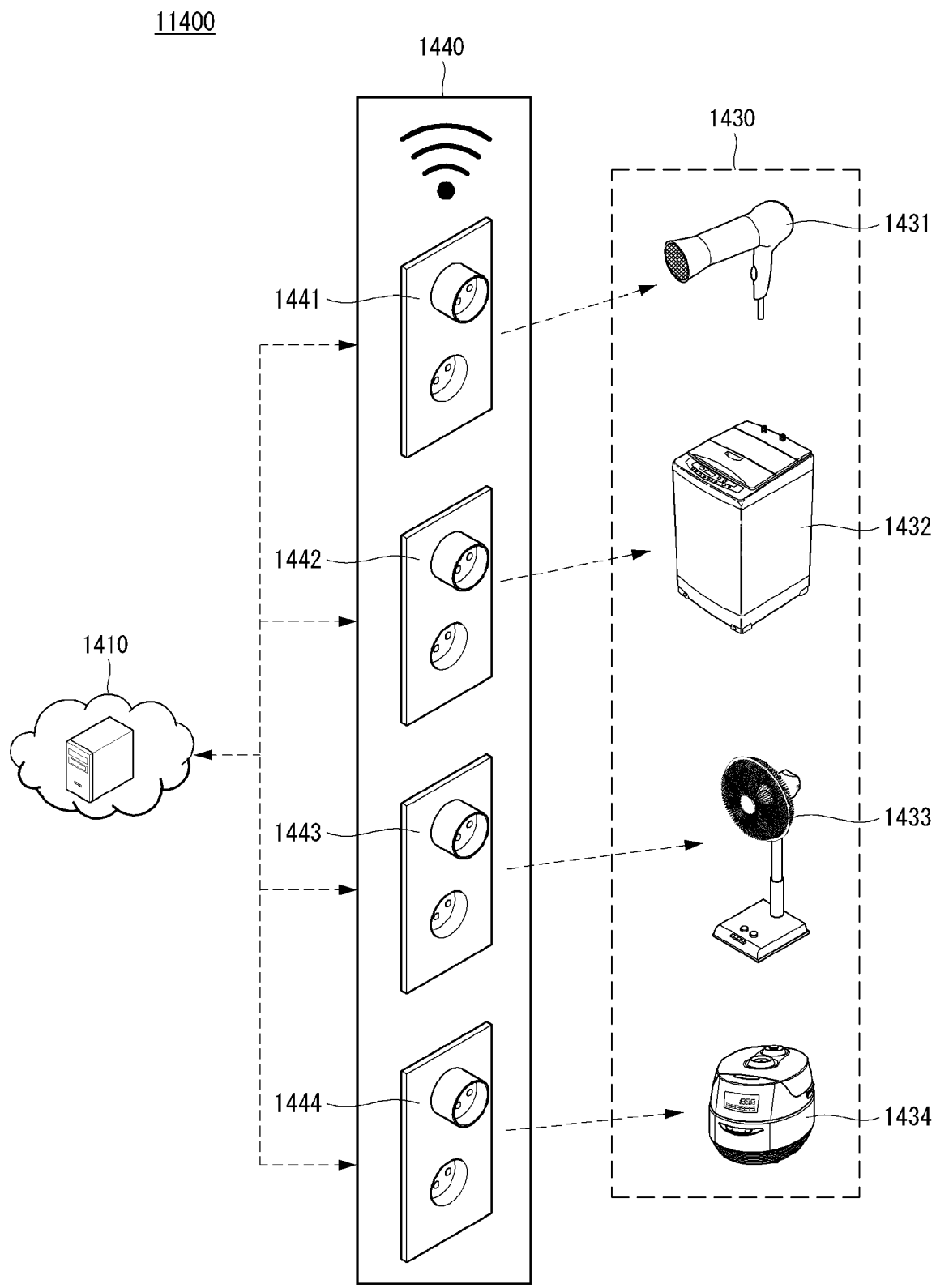

INTELLIGENT METHOD FOR CONTROLLING HOME APPLIANCE, APPARATUS AND INTELLIGENT COMPUTING DEVICE FOR CONTROLLING HOME APPLIANCE

CROSS-REFERENCE TO RELATED APPLICATIONS

This application is based on and claims priority under 35 U.S.C. § 119(a) to Korean Patent Application No. 10-2019-0084089, which was filed on Jul. 11, 2019, in the Korean Intellectual Property Office, the disclosure of which is incorporated herein in its entirety by reference.

BACKGROUND OF THE INVENTION

Field of the Invention

The present invention relates an intelligent method for controlling a home appliance and an apparatus and intelligent computing device for controlling a home appliance, and more particularly, to an intelligent method for controlling a home appliance and an apparatus and intelligent computing device for controlling a home appliance, which efficiently control power of a home appliance.

Related Art

Recently, various types of user interfaces (UI) have been provided to users through Internet of Things (IoT) devices.

Recently, IoT outlets or smart plugs have been commonly used due to popularization of IoT devices. Smart plugs according to existing technologies provide functions to reduce standby power of IoT devices, to shut off power supply, and to manage a usage time of IoT devices.

However, the reality is that interfaces provided through the smart plugs are limited and passive. This means that the interfaces do not react to usability of home appliances which are periodically changed.

In particular, most home appliances on the basis of existing technologies including existing IoT devices operate upon receiving user inputs and have no function of analyzing users' life patterns.

In addition, existing home appliances are not communicatively connected to mobile terminals (e.g., smartphones) of users in many cases, and thus, it is difficult to intelligently manage the corresponding home appliances.

SUMMARY OF THE INVENTION

An object of the present invention is to meet the needs and solve the problems.

The present invention provides an apparatus for controlling a home appliance capable of optimizing power consumption of each home appliance using a mobile terminal connected to a smart plug wiredly connected to each home appliance, and an intelligent method for controlling a home appliance thereby.

In an aspect, an intelligent method for controlling a home appliance includes: obtaining power usage data of a device receiving power from a plug, from the plug; generating information related to an optimal usage setting for the device on the basis of the power usage data of the device; and controlling power provided to the device through the plug on the basis of the information related to the optimal usage setting.

The obtaining of the power usage data of the device may include: dividing power usage of the device by timeslot; and generating a power usage history of the device by timeslot.

The power usage history of each device by timeslot may include information related to power usage history of the device in units of seconds, minutes, hours, days, weeks, months, or years.

The obtaining of the power usage data of the device may include: generating usage pattern information of the device on the basis of the power usage data of the device; and displaying the usage pattern information of the device on a display.

The usage pattern information of the device may include at least one of a name of the device, a latest use state of the device, and a position of the device.

The generating of the information related to the optimal usage setting for the device may include: displaying information related to the optimal usage setting on the display.

The information related to the optimal usage setting may include at least one of information related to an operation state of the device, power usage of the device for a predetermined period of time, a cumulative usage of the device, and the optimal usage setting of the device.

The information related to the optimal usage setting of the device may include information related to an optimal usage time of the device by preset timeslot.

The generating of the information related to the optimal usage setting for the device may include: extracting a feature value from the power usage data of the device; inputting the feature value into a pre-learned deep learning model; and obtaining information related to an optimal usage setting for the device on the basis of an output of the deep learning model.

The method may further include: receiving a downlink control information (DCI) used for scheduling transmission of the power usage data of the device from a network, wherein the power usage data of the device is transmitted to the network on the basis of the DCI.

The method may further include: performing an initial access procedure with the network on the basis of a synchronization signal block (SSB), wherein the power usage data of the device is transmitted to the network through a PUSCH, and the SSB and a DM-RS of the PUSCH may be quasi-co-located, QCL, for a QCL type D.

The method may further include: controlling a communication unit to transmit the power usage data of the device to an artificial intelligence (AI) processor included in the network; and controlling the communication unit to receive AI-processed information from the AI processor, wherein the AI-processed information is information related to the optimal usage setting of the device.

In another aspect, a home appliance control apparatus for intelligently controlling a home appliance includes: a communication unit communicatively connected to a plug; a processor controlling the communication unit; and a memory including a command executable by the processor, wherein the command causes the processor to obtain power usage data of a device which is provided with power from the plug, from the plug, generate information related to an optimal usage setting for the device on the basis of the power usage data of the device, and control power provided to the device through the plug on the basis of information related to the optimal usage setting.

The processor may divide power usage of the device by timeslot and generate power usage history of the device by timeslot.

The power usage history of each device by timeslot may include information related to power usage history of the device in units of seconds, minutes, hours, days, weeks, months, or years.

The apparatus may further include: a display, wherein the processor generates usage pattern information of the device on the basis of the power usage data of the device and displays the usage pattern information of the device on the display.

The usage pattern information of the device may include at least one of a name of the device, a latest use state of the device, and a position of the device.

Information related to the optimal usage setting may be displayed on the display.

The information related to the optimal usage setting may include at least one of information related to an operation state of the device, power usage of the device for a predetermined period of time, a cumulative usage of the device, and the optimal usage setting of the device.

In another aspect, a recording medium as a non-transitory computer-readable medium in which a computer-executable component configured to be executed in at least one processor of a computing device is stored, wherein the computer-executable component obtains power usage data of a device provided with power from a plug from the plug, generates information related to an optimal usage setting for the device on the basis of the power usage data of the device, and controls power supplied to the device through the plug on the basis of information related to the optimal usage setting.

BRIEF DESCRIPTION OF THE DRAWINGS

FIG. 1 shows an example of a block diagram of a wireless communication system to which methods proposed in the present specification is applicable.

FIG. 2 is a diagram showing an example of a signal transmitting/receiving method in a wireless communication system.

FIG. 3 shows an example of a user terminal and a 5G network in a 5G communication system.

FIG. 4 illustrates a home appliance system according to an embodiment of the present invention.

FIG. 5 shows a block diagram of an AI device that may be applied to one embodiment of the present invention.

FIG. 6 illustrates an apparatus for controlling a home appliance according to an embodiment of the present invention.

FIG. 7 is a flowchart of a method for controlling a home appliance according to an embodiment of the present invention.

FIG. 8 is a flowchart specifically illustrating a power usage history obtaining step of FIG. 7.

FIG. 9 is a flowchart specifically illustrating an optimal usage setting determination step of FIG. 7.

FIG. 10 shows an example of displaying usage pattern information of each home appliance.

FIG. 11 is a flowchart of an example of performing the step of determining an optimal usage setting of FIG. 9 through AI processing.

FIG. 12 is a flowchart of an example of performing the step of determining an optimal usage setting of FIG. 9 through AI processing of a 5G network.

FIG. 13 shows an example of displaying an optimal usage setting.

FIG. 14 shows a home appliance system according to another embodiment of the present invention.

DESCRIPTION OF EXEMPLARY EMBODIMENTS

Hereinafter, embodiments of the disclosure will be described in detail with reference to the attached drawings. The same or similar components are given the same reference numbers and redundant description thereof is omitted. The suffixes "module" and "unit" of elements herein are used for convenience of description and thus can be used interchangeably and do not have any distinguishable meanings or functions. Further, in the following description, if a detailed description of known techniques associated with the present invention would unnecessarily obscure the gist of the present invention, detailed description thereof will be omitted. In addition, the attached drawings are provided for easy understanding of embodiments of the disclosure and do not limit technical spirits of the disclosure, and the embodiments should be construed as including all modifications, equivalents, and alternatives falling within the spirit and scope of the embodiments.

While terms, such as "first", "second", etc., may be used to describe various components, such components must not be limited by the above terms. The above terms are used only to distinguish one component from another.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements.

The singular forms are intended to include the plural forms as well, unless the context clearly indicates otherwise.

In addition, in the specification, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Hereinafter, 5G communication (5th generation mobile communication) required by an apparatus requiring AI processed information and/or an AI processor will be described through paragraphs A through G.

A. Example of Block Diagram of UE and 5G Network

FIG. 1 is a block diagram of a wireless communication system to which methods proposed in the disclosure are applicable.

Referring to FIG. 1, a device (AI device) including an AI module is defined as a first communication device (910 of FIG. 1), and a processor 911 can perform detailed AI operation.

A 5G network including another device (AI server) communicating with the AI device is defined as a second communication device (920 of FIG. 1), and a processor 921 can perform detailed AI operations.

The 5G network may be represented as the first communication device and the AI device may be represented as the second communication device.

For example, the first communication device or the second communication device may be a base station, a network node, a transmission terminal, a reception terminal, a wireless device, a wireless communication device, an autonomous device, or the like.

For example, the first communication device or the second communication device may be a base station, a network node, a transmission terminal, a reception terminal, a wireless device, a wireless communication device, a vehicle, a vehicle having an autonomous function, a connected car, a drone (Unmanned Aerial Vehicle, UAV), and AI (Artificial Intelligence) module, a robot, an AR (Augmented Reality) device, a VR (Virtual Reality) device, an MR (Mixed Reality) device, a hologram device, a public safety device, an MTC device, an IoT device, a medical device, a Fin Tech device (or financial device), a security device, a climate/environment device, a device associated with 5G services, or other devices associated with the fourth industrial revolution field.

For example, a terminal or user equipment (UE) may include a cellular phone, a smart phone, a laptop computer, a digital broadcast terminal, personal digital assistants (PDAs), a portable multimedia player (PMP), a navigation device, a slate PC, a tablet PC, an ultrabook, a wearable device (e.g., a smartwatch, a smart glass and a head mounted display (HMD)), etc. For example, the HMD may be a display device worn on the head of a user. For example, the HMD may be used to realize VR, AR or MR. For example, the drone may be a flying object that flies by wireless control signals without a person therein. For example, the VR device may include a device that implements objects or backgrounds of a virtual world. For example, the AR device may include a device that connects and implements objects or background of a virtual world to objects, backgrounds, or the like of a real world. For example, the MR device may include a device that unites and implements objects or background of a virtual world to objects, backgrounds, or the like of a real world. For example, the hologram device may include a device that implements 360-degree 3D images by recording and playing 3D information using the interference phenomenon of light that is generated by two lasers meeting each other which is called holography. For example, the public safety device may include an image repeater or an imaging device that can be worn on the body of a user. For example, the MTC device and the IoT device may be devices that do not require direct interference or operation by a person. For example, the MTC device and the IoT device may include a smart meter, a bending machine, a thermometer, a smart bulb, a door lock, various sensors, or the like. For example, the medical device may be a device that is used to diagnose, treat, attenuate, remove, or prevent diseases. For example, the medical device may be a device that is used to diagnose, treat, attenuate, or correct injuries or disorders. For example, the medial device may be a device that is used to examine, replace, or change structures or functions. For example, the medical device may be a device that is used to control pregnancy. For example, the medical device may include a device for medical treatment, a device for operations, a device for (external) diagnose, a hearing aid, an operation device, or the like. For example, the security device may be a device that is installed to prevent a danger that is likely to occur and to keep safety. For example, the security device may be a camera, a CCTV, a recorder, a black box, or the like. For example, the Fin Tech device may be a device that can provide financial services such as mobile payment.

Referring to FIG. 1, the first communication device 910 and the second communication device 920 include processors 911 and 921, memories 914 and 924, one or more Tx/Rx radio frequency (RF) modules 915 and 925, Tx processors 912 and 922, Rx processors 913 and 923, and antennas 916 and 926. The Tx/Rx module is also referred to as a transceiver. Each Tx/Rx module 915 transmits a signal through each antenna 926. The processor implements the aforementioned functions, processes and/or methods. The processor 921 may be related to the memory 924 that stores program code and data. The memory may be referred to as a computer-readable medium. More specifically, the Tx processor 912 implements various signal processing functions with respect to L1 (i.e., physical layer) in DL (communication from the first communication device to the second communication device). The Rx processor implements various signal processing functions of L1 (i.e., physical layer).

UL (communication from the second communication device to the first communication device) is processed in the first communication device 910 in a way similar to that described in association with a receiver function in the second communication device 920. Each Tx/Rx module 925 receives a signal through each antenna 926. Each Tx/Rx module provides RF carriers and information to the Rx processor 923. The processor 921 may be related to the memory 924 that stores program code and data. The memory may be referred to as a computer-readable medium.

B. Signal Transmission/Reception Method in Wireless Communication System

FIG. 2 is a diagram showing an example of a signal transmission/reception method in a wireless communication system.

Referring to FIG. 2, when a UE is powered on or enters a new cell, the UE performs an initial cell search operation such as synchronization with a BS (S201). For this operation, the UE can receive a primary synchronization channel (P-SCH) and a secondary synchronization channel (S-SCH) from the BS to synchronize with the BS and obtain information such as a cell ID. In LTE and NR systems, the P-SCH and S-SCH are respectively called a primary synchronization signal (PSS) and a secondary synchronization signal (SSS). After initial cell search, the UE can obtain broadcast information in the cell by receiving a physical broadcast channel (PBCH) from the BS. Further, the UE can receive a downlink reference signal (DL RS) in the initial cell search step to check a downlink channel state. After initial cell search, the UE can obtain more detailed system information by receiving a physical downlink shared channel (PDSCH) according to a physical downlink control channel (PDCCH) and information included in the PDCCH (S202).

Meanwhile, when the UE initially accesses the BS or has no radio resource for signal transmission, the UE can perform a random access procedure (RACH) for the BS (steps S203 to S206). To this end, the UE can transmit a specific sequence as a preamble through a physical random access channel (PRACH) (S203 and S205) and receive a random access response (RAR) message for the preamble through a PDCCH and a corresponding PDSCH (S204 and S206). In the case of a contention-based RACH, a contention resolution procedure may be additionally performed.

After the UE performs the above-described process, the UE can perform PDCCH/PDSCH reception (S207) and physical uplink shared channel (PUSCH)/physical uplink control channel (PUCCH) transmission (S208) as normal uplink/downlink signal transmission processes. Particularly, the UE receives downlink control information (DCI) through the PDCCH. The UE monitors a set of PDCCH candidates in monitoring occasions set for one or more control element sets (CORESET) on a serving cell according to corresponding search space configurations. A set of PDCCH candidates to be monitored by the UE is defined in terms of search space sets, and a search space set may be a common search space set or a UE-specific search space set.

CORESET includes a set of (physical) resource blocks having a duration of one to three OFDM symbols. A network can configure the UE such that the UE has a plurality of CORESETs. The UE monitors PDCCH candidates in one or more search space sets. Here, monitoring means attempting decoding of PDCCH candidate(s) in a search space. When the UE has successfully decoded one of PDCCH candidates in a search space, the UE determines that a PDCCH has been detected from the PDCCH candidate and performs PDSCH reception or PUSCH transmission on the basis of DCI in the detected PDCCH. The PDCCH can be used to schedule DL transmissions over a PDSCH and UL transmissions over a PUSCH. Here, the DCI in the PDCCH includes downlink assignment (i.e., downlink grant (DL grant)) related to a physical downlink shared channel and including at least a modulation and coding format and resource allocation information, or an uplink grant (UL grant) related to a physical uplink shared channel and including a modulation and coding format and resource allocation information.

An initial access (IA) procedure in a 5G communication system will be additionally described with reference to FIG. 2.

The UE can perform cell search, system information acquisition, beam alignment for initial access, and DL measurement on the basis of an SSB. The SSB is interchangeably used with a synchronization signal/physical broadcast channel (SS/PBCH) block.

The SSB includes a PSS, an SSS and a PBCH. The SSB is configured in four consecutive OFDM symbols, and a PSS, a PBCH, an SSS/PBCH or a PBCH is transmitted for each OFDM symbol. Each of the PSS and the SSS includes one OFDM symbol and 127 subcarriers, and the PBCH includes 3 OFDM symbols and 576 subcarriers.

Cell search refers to a process in which a UE obtains time/frequency synchronization of a cell and detects a cell identifier (ID) (e.g., physical layer cell ID (PCI)) of the cell. The PSS is used to detect a cell ID in a cell ID group and the SSS is used to detect a cell ID group. The PBCH is used to detect an SSB (time) index and a half-frame.

There are 336 cell ID groups and there are 3 cell IDs per cell ID group. A total of 1008 cell IDs are present. Information on a cell ID group to which a cell ID of a cell belongs is provided/obtained through an SSS of the cell, and information on the cell ID among 336 cell ID groups is provided/obtained through a PSS.

The SSB is periodically transmitted in accordance with SSB periodicity. A default SSB periodicity assumed by a UE during initial cell search is defined as 20 ms. After cell access, the SSB periodicity can be set to one of {5 ms, 10 ms, 20 ms, 40 ms, 80 ms, 160 ms} by a network (e.g., a BS).

Next, acquisition of system information (SI) will be described.

SI is divided into a master information block (MIB) and a plurality of system information blocks (SIBs). SI other than the MIB may be referred to as remaining minimum system information. The MIB includes information/parameter for monitoring a PDCCH that schedules a PDSCH carrying SIB1 (SystemInformationBlock1) and is transmitted by a BS through a PBCH of an SSB. SIB1 includes information related to availability and scheduling (e.g., transmission periodicity and SI-window size) of the remaining SIBs (hereinafter, SIBx, x is an integer equal to or greater than 2). SiBx is included in an SI message and transmitted over a PDSCH. Each SI message is transmitted within a periodically generated time window (i.e., SI-window).

A random access (RA) procedure in a 5G communication system will be additionally described with reference to FIG. 2.

A random access procedure is used for various purposes. For example, the random access procedure can be used for network initial access, handover, and UE-triggered UL data transmission. A UE can obtain UL synchronization and UL transmission resources through the random access procedure. The random access procedure is classified into a contention-based random access procedure and a contention-free random access procedure. A detailed procedure for the contention-based random access procedure is as follows.

A UE can transmit a random access preamble through a PRACH as Msg1 of a random access procedure in UL. Random access preamble sequences having different two lengths are supported. A long sequence length 839 is applied to subcarrier spacings of 1.25 kHz and 5 kHz and a short sequence length 139 is applied to subcarrier spacings of 15 kHz, 30 kHz, 60 kHz and 120 kHz.

When a BS receives the random access preamble from the UE, the BS transmits a random access response (RAR) message (Msg2) to the UE. A PDCCH that schedules a PDSCH carrying a RAR is CRC masked by a random access (RA) radio network temporary identifier (RNTI) (RA-RNTI) and transmitted. Upon detection of the PDCCH masked by the RA-RNTI, the UE can receive a RAR from the PDSCH scheduled by DCI carried by the PDCCH. The UE checks whether the RAR includes random access response information with respect to the preamble transmitted by the UE, that is, Msg1. Presence or absence of random access information with respect to Msg1 transmitted by the UE can be determined according to presence or absence of a random access preamble ID with respect to the preamble transmitted by the UE. If there is no response to Msg1, the UE can retransmit the RACH preamble less than a predetermined number of times while performing power ramping. The UE calculates PRACH transmission power for preamble retransmission on the basis of most recent pathloss and a power ramping counter.

The UE can perform UL transmission through Msg3 of the random access procedure over a physical uplink shared channel on the basis of the random access response information. Msg3 can include an RRC connection request and a UE ID. The network can transmit Msg4 as a response to Msg3, and Msg4 can be handled as a contention resolution message on DL. The UE can enter an RRC connected state by receiving Msg4.

C. Beam Management (BM) Procedure of 5G Communication System

A BM procedure can be divided into (1) a DL MB procedure using an SSB or a CSI-RS and (2) a UL BM procedure using a sounding reference signal (SRS). In addition, each BM procedure can include Tx beam swiping for determining a Tx beam and Rx beam swiping for determining an Rx beam.

The DL BM procedure using an SSB will be described.

Configuration of a beam report using an SSB is performed when channel state information (CSI)/beam is configured in RRC_CONNECTED.

- A UE receives a CSI-ResourceConfig IE including CSI-SSB-ResourceSetList for SSB resources used for BM from a BS. The RRC parameter "csi-SSB-ResourceSetList" represents a list of SSB resources used for beam management and report in one resource set. Here, an SSB resource set can be set as {SSBx1, SSBx2, SSBx3, SSBx4, . . . }. An SSB index can be defined in the range of 0 to 63.

The UE receives the signals on SSB resources from the BS on the basis of the CSI-SSB-ResourceSetList.

When CSI-RS reportConfig with respect to a report on SSBRI and reference signal received power (RSRP) is set, the UE reports the best SSBRI and RSRP corresponding thereto to the BS. For example, when reportQuantity of the CSI-RS reportConfig IE is set to 'ssb-Index-RSRP', the UE reports the best SSBRI and RSRP corresponding thereto to the BS.

When a CSI-RS resource is configured in the same OFDM symbols as an SSB and 'QCL-TypeD' is applicable, the UE can assume that the CSI-RS and the SSB are quasi co-located (QCL) from the viewpoint of 'QCL-TypeD'. Here, QCL-TypeD may mean that antenna ports are quasi co-located from the viewpoint of a spatial Rx parameter. When the UE receives signals of a plurality of DL antenna ports in a QCL-TypeD relationship, the same Rx beam can be applied.

Next, a DL BM procedure using a CSI-RS will be described.

An Rx beam determination (or refinement) procedure of a UE and a Tx beam swiping procedure of a BS using a CSI-RS will be sequentially described. A repetition parameter is set to 'ON' in the Rx beam determination procedure of a UE and set to 'OFF' in the Tx beam swiping procedure of a BS.

First, the Rx beam determination procedure of a UE will be described.

The UE receives an NZP CSI-RS resource set IE including an RRC parameter with respect to 'repetition' from a BS through RRC signaling. Here, the RRC parameter 'repetition' is set to 'ON'.

The UE repeatedly receives signals on resources in a CSI-RS resource set in which the RRC parameter 'repetition' is set to 'ON' in different OFDM symbols through the same Tx beam (or DL spatial domain transmission filters) of the BS.

The UE determines an RX beam thereof.

The UE skips a CSI report. That is, the UE can skip a CSI report when the RRC parameter 'repetition' is set to 'ON'.

Next, the Tx beam determination procedure of a BS will be described.

A UE receives an NZP CSI-RS resource set IE including an RRC parameter with respect to 'repetition' from the BS through RRC signaling. Here, the RRC parameter 'repetition' is related to the Tx beam swiping procedure of the BS when set to 'OFF'.

The UE receives signals on resources in a CSI-RS resource set in which the RRC parameter 'repetition' is set to 'OFF' in different DL spatial domain transmission filters of the BS.

The UE selects (or determines) a best beam.

The UE reports an ID (e.g., CRI) of the selected beam and related quality information (e.g., RSRP) to the BS. That is, when a CSI-RS is transmitted for BM, the UE reports a CRI and RSRP with respect thereto to the BS.

Next, the UL BM procedure using an SRS will be described.

A UE receives RRC signaling (e.g., SRS-Config IE) including a (RRC parameter) purpose parameter set to 'beam management" from a BS. The SRS-Config IE is used to set SRS transmission. The SRS-Config IE includes a list of SRS-Resources and a list of SRS-ResourceSets. Each SRS resource set refers to a set of SRS-resources.

The UE determines Tx beamforming for SRS resources to be transmitted on the basis of SRS-SpatialRelation Info included in the SRS-Config IE. Here, SRS-SpatialRelation Info is set for each SRS resource and indicates whether the same beamforming as that used for an SSB, a CSI-RS or an SRS will be applied for each SRS resource.

When SRS-SpatialRelationInfo is set for SRS resources, the same beamforming as that used for the SSB, CSI-RS or SRS is applied. However, when SRS-SpatialRelationInfo is not set for SRS resources, the UE arbitrarily determines Tx beamforming and transmits an SRS through the determined Tx beamforming.

Next, a beam failure recovery (BFR) procedure will be described.

In a beamformed system, radio link failure (RLF) may frequently occur due to rotation, movement or beamforming blockage of a UE. Accordingly, NR supports BFR in order to prevent frequent occurrence of RLF. BFR is similar to a radio link failure recovery procedure and can be supported when a UE knows new candidate beams. For beam failure detection, a BS configures beam failure detection reference signals for a UE, and the UE declares beam failure when the number of beam failure indications from the physical layer of the UE reaches a threshold set through RRC signaling within a period set through RRC signaling of the BS. After beam failure detection, the UE triggers beam failure recovery by initiating a random access procedure in a PCell and performs beam failure recovery by selecting a suitable beam. (When the BS provides dedicated random access resources for certain beams, these are prioritized by the UE). Completion of the aforementioned random access procedure is regarded as completion of beam failure recovery.

D. URLLC (Ultra-Reliable and Low Latency Communication)

URLLC transmission defined in NR can refer to (1) a relatively low traffic size, (2) a relatively low arrival rate, (3) extremely low latency requirements (e.g., 0.5 and 1 ms), (4) relatively short transmission duration (e.g., 2 OFDM symbols), (5) urgent services/messages, etc. In the case of UL, transmission of traffic of a specific type (e.g., URLLC) needs to be multiplexed with another transmission (e.g., eMBB) scheduled in advance in order to satisfy more stringent latency requirements. In this regard, a method of providing information indicating preemption of specific resources to a UE scheduled in advance and allowing a URLLC UE to use the resources for UL transmission is provided.

NR supports dynamic resource sharing between eMBB and URLLC. eMBB and URLLC services can be scheduled on non-overlapping time/frequency resources, and URLLC transmission can occur in resources scheduled for ongoing eMBB traffic. An eMBB UE may not ascertain whether PDSCH transmission of the corresponding UE has been partially punctured and the UE may not decode a PDSCH due to corrupted coded bits. In view of this, NR provides a preemption indication. The preemption indication may also be referred to as an interrupted transmission indication.

With regard to the preemption indication, a UE receives DownlinkPreemption IE through RRC signaling from a BS. When the UE is provided with DownlinkPreemption IE, the UE is configured with INT-RNTI provided by a parameter int-RNTI in DownlinkPreemption IE for monitoring of a PDCCH that conveys DCI format 2_1. The UE is additionally configured with a corresponding set of positions for fields in DCI format 2_1 according to a set of serving cells and positionInDCI by INT-ConfigurationPerServing Cell including a set of serving cell indexes provided by serving-CellID, configured having an information payload size for DCI format 2_1 according to dci-Payloadsize, and configured with indication granularity of time-frequency resources according to timeFrequencySect.

The UE receives DCI format 2_1 from the BS on the basis of the DownlinkPreemption IE.

When the UE detects DCI format 2_1 for a serving cell in a configured set of serving cells, the UE can assume that there is no transmission to the UE in PRBs and symbols indicated by the DCI format 2_1 in a set of PRBs and a set of symbols in a last monitoring period before a monitoring period to which the DCI format 2_1 belongs. For example, the UE assumes that a signal in a time-frequency resource indicated according to preemption is not DL transmission scheduled therefor and decodes data on the basis of signals received in the remaining resource region.

E. mMTC (Massive MTC)

mMTC (massive Machine Type Communication) is one of 5G scenarios for supporting a hyper-connection service providing simultaneous communication with a large number of UEs. In this environment, a UE intermittently performs communication with a very low speed and mobility. Accordingly, a main goal of mMTC is operating a UE for a long time at a low cost. With respect to mMTC, 3GPP deals with MTC and NB (NarrowBand)-IoT.

mMTC has features such as repetitive transmission of a PDCCH, a PUCCH, a PDSCH (physical downlink shared channel), a PUSCH, etc., frequency hopping, retuning, and a guard period.

That is, a PUSCH (or a PUCCH (particularly, a long PUCCH) or a PRACH) including specific information and a PDSCH (or a PDCCH) including a response to the specific information are repeatedly transmitted. Repetitive transmission is performed through frequency hopping, and for repetitive transmission, (RF) retuning from a first frequency resource to a second frequency resource is performed in a guard period and the specific information and the response to the specific information can be transmitted/received through a narrowband (e.g., 6 resource blocks (RBs) or 1 RB).

F. Basic Operation of AI Processing Using 5G Communication

FIG. 3 shows an example of basic operations of AI processing in a 5G communication system.

The UE transmits specific information to the 5G network (S1). The 5G network may perform 5G processing related to the specific information (S2). Here, the 5G processing may include AI processing. And the 5G network may transmit response including AI processing result to UE (S3).

G. Applied Operations Between UE and 5G Network in 5G Communication System

Hereinafter, the operation of an autonomous vehicle using 5G communication will be described in more detail with reference to wireless communication technology (BM procedure, URLLC, mMTC, etc.) described in FIGS. 1 and 2.

First, a basic procedure of an applied operation to which a method proposed by the present invention which will be described later and eMBB of 5G communication are applied will be described.

As in steps S1 and S3 of FIG. 3, the autonomous vehicle performs an initial access procedure and a random access procedure with the 5G network prior to step S1 of FIG. 3 in order to transmit/receive signals, information and the like to/from the 5G network.

More specifically, the autonomous vehicle performs an initial access procedure with the 5G network on the basis of an SSB in order to obtain DL synchronization and system information. A beam management (BM) procedure and a beam failure recovery procedure may be added in the initial access procedure, and quasi-co-location (QCL) relation may be added in a process in which the autonomous vehicle receives a signal from the 5G network.

In addition, the autonomous vehicle performs a random access procedure with the 5G network for UL synchronization acquisition and/or UL transmission. The 5G network can transmit, to the autonomous vehicle, a UL grant for scheduling transmission of specific information. Accordingly, the autonomous vehicle transmits the specific information to the 5G network on the basis of the UL grant. In addition, the 5G network transmits, to the autonomous vehicle, a DL grant for scheduling transmission of 5G processing results with respect to the specific information. Accordingly, the 5G network can transmit, to the autonomous vehicle, information (or a signal) related to remote control on the basis of the DL grant.

Next, a basic procedure of an applied operation to which a method proposed by the present invention which will be described later and URLLC of 5G communication are applied will be described.

As described above, an autonomous vehicle can receive DownlinkPreemption IE from the 5G network after the autonomous vehicle performs an initial access procedure and/or a random access procedure with the 5G network. Then, the autonomous vehicle receives DCI format 2_1 including a preemption indication from the 5G network on the basis of DownlinkPreemption IE. The autonomous vehicle does not perform (or expect or assume) reception of eMBB data in resources (PRBs and/or OFDM symbols) indicated by the preemption indication. Thereafter, when the autonomous vehicle needs to transmit specific information, the autonomous vehicle can receive a UL grant from the 5G network.

Next, a basic procedure of an applied operation to which a method proposed by the present invention which will be described later and mMTC of 5G communication are applied will be described.

Description will focus on parts in the steps of FIG. 3 which are changed according to application of mMTC.

In step S1 of FIG. 3, the autonomous vehicle receives a UL grant from the 5G network in order to transmit specific information to the 5G network. Here, the UL grant may include information on the number of repetitions of transmission of the specific information and the specific information may be repeatedly transmitted on the basis of the information on the number of repetitions. That is, the autonomous vehicle transmits the specific information to the 5G network on the basis of the UL grant. Repetitive transmission of the specific information may be performed through frequency hopping, the first transmission of the specific information may be performed in a first frequency resource, and the second transmission of the specific information may be performed in a second frequency resource. The specific information can be transmitted through a narrowband of 6 resource blocks (RBs) or 1 RB.

The above-described 5G communication technology can be combined with methods proposed in the present invention which will be described later and applied or can complement the methods proposed in the present invention to make technical features of the methods concrete and clear.

FIG. 4 illustrates a home appliance system according to an embodiment of the present invention.

As shown in FIG. 4, a home appliance system 100 may include an intelligent computing device 10, a plurality of smart plugs 40, and a plurality of home appliances 30 (i.e., multiple home appliances).

Each of the plurality of home appliances 31, 32, 33, and 34 may be an IoT device. The plurality of home appliances 31, 32, 33, and 34 may be wiredly connected to the smart plugs 41, 42, 43, and 44, respectively.

Each of the smart plugs 41, 42, 43, and 44 may be a smart plug or an IOT outlet. The smart plugs 41, 42, 43, and 44 may provide external power to the home appliances 31, 32, 33, and 34, respectively.

A terminal 10 may be an example of a home appliance control apparatus according to an embodiment of the present invention. The terminal 10 may be a mobile terminal. The terminal 10 may be a smartphone. The terminal 10 may be any type of smart device capable of controlling home appliances as well as a smart phone.

The terminal 10 may be communicatively connected to the smart plugs 41, 42, 43, and 44. The terminal 10 may perform wired/wireless communication with each of the smart plugs 41, 42, 43, and 44. The terminal 10 may obtain power usage data of each of the home appliances 31, 32, 33, and 34 from the smart plugs 41, 42, 43, and 44 connected for wired/wireless communication.

The terminal 10 may divide power usage data of each of the home appliances 31, 32, 33, and 34 obtained from the smart plugs 41, 42, 43, and 44 by timeslot. The terminal 10 may generate usage pattern information of each of the home appliances 31, 32, 33, and 34 using the power usage data of the home appliances 31, 32, 33, and 34 divided by timeslot.

The terminal 10 may determine an optimal usage setting (or smart setting) for optimizing the use of power at home on the basis of the usage pattern information of each of the home appliance 31, 32, 33 and 34.

The terminal 10 may display information related to optimal usage setting on the display of the terminal 10. The terminal 10 may control power provided to each of the home appliances 31, 32, 33, and 34 using the optimal usage setting. The terminal 10 may cut off/supply power provided to each of the home appliances 31, 32, 33, and 34 using the optimal usage setting.

FIG. 5 shows a block diagram of an AI device that may be applied to one embodiment of the present invention.

The AI device 20 may include an electronic device including an AI module capable of performing AI processing or a server including the AI module. In addition, the AI device 20 may be included in at least a part of the speech providing device 10 illustrated in FIG. 4 and may be provided to perform at least some of the AI processing together.

The AI processing may include all operations related to the control of the terminal 10 shown in FIG. 4. For example, the terminal 10 may AI-process power usage data of each home appliance transmitted from each smart plug to perform processing/determination or a control signal generation operation. In addition, for example, the terminal 10 may AI-process data received through the communication unit to perform control of the terminal.

The AI device 20 may include an AI processor 21, a memory 25, and/or a communication unit 27.

The AI device 20 is a computing device capable of learning neural networks, and may be implemented as various electronic devices such as a server, a desktop PC, a notebook PC, a tablet PC, and the like.

The AI processor 21 may learn a neural network using a program stored in the memory 25.

In particular, the AI processor 21 may learn a neural network for obtaining estimated noise information by analyzing the operating state of each speech providing device. In this case, the neural network for outputting estimated noise information may be designed to simulate the human's brain structure on a computer, and may include a plurality of network nodes having weight and simulating the neurons of the human's neural network.

The plurality of network nodes can transmit and receive data in accordance with each connection relationship to simulate the synaptic activity of neurons in which neurons transmit and receive signals through synapses. Here, the neural network may include a deep learning model developed from a neural network model. In the deep learning model, a plurality of network nodes is positioned in different layers and can transmit and receive data in accordance with a convolution connection relationship. The neural network, for example, includes various deep learning techniques such as deep neural networks (DNN), convolutional deep neural networks (CNN), recurrent neural networks (RNN), a restricted boltzmann machine (RBM), deep belief networks (DBN), and a deep Q-network, and can be applied to fields such as computer vision, speech providing, natural language processing, and voice/signal processing.

Meanwhile, a processor that performs the functions described above may be a general purpose processor (e.g., a CPU), but may be an AI-only processor (e.g., a GPU) for artificial intelligence learning.

The memory 25 can store various programs and data for the operation of the AI device 20. The memory 25 may be a nonvolatile memory, a volatile memory, a flash-memory, a hard disk drive (HDD), a solid state drive (SDD), or the like. The memory 25 is accessed by the AI processor 21 and reading-out/recording/correcting/deleting/updating, etc. of data by the AI processor 21 can be performed. Further, the memory 25 can store a neural network model (e.g., a deep learning model 26) generated through a learning algorithm for data classification/recognition according to an embodiment of the present invention.

Meanwhile, the AI processor 21 may include a data learning unit 22 that learns a neural network for data classification/recognition. The data learning unit 22 can learn references about what learning data are used and how to classify and recognize data using the learning data in order to determine data classification/recognition. The data learning unit 22 can learn a deep learning model by obtaining learning data to be used for learning and by applying the obtained learning data to the deep learning model.

The data learning unit 22 may be manufactured in the type of at least one hardware chip and mounted on the AI device 20. For example, the data learning unit 22 may be manufactured in a hardware chip type only for artificial intelligence, and may be manufactured as a part of a general purpose processor (CPU) or a graphics processing unit (GPU) and mounted on the AI device 20. Further, the data learning unit 22 may be implemented as a software module. When the data leaning unit 22 is implemented as a software module (or a program module including instructions), the software module may be stored in non-transitory computer readable media that can be read through a computer. In this case, at least one software module may be provided by an OS (operating system) or may be provided by an application.

The data learning unit 22 may include a learning data obtaining unit 23 and a model learning unit 24.

The learning data acquisition unit 23 may obtain training data for a neural network model for classifying and recognizing data. For example, the learning data acquisition unit 23 may obtain an operating state to be input to the neural network model and/or a feature value, extracted from the operating state, as the training data.

The model learning unit 24 can perform learning such that a neural network model has a determination reference about how to classify predetermined data, using the obtained learning data. In this case, the model learning unit 24 can train a neural network model through supervised learning that uses at least some of learning data as a determination reference. Alternatively, the model learning data 24 can train a neural network model through unsupervised learning that finds out a determination reference by performing learning by itself using learning data without supervision. Further, the model learning unit 24 can train a neural network model through reinforcement learning using feedback about whether the result of situation determination according to learning is correct. Further, the model learning unit 24 can train a neural network model using a learning algorithm including error back-propagation or gradient decent.

When a neural network model is learned, the model learning unit 24 can store the learned neural network model in the memory. The model learning unit 24 may store the learned neural network model in the memory of a server connected with the AI device 20 through a wire or wireless network.

The data learning unit 22 may further include a learning data preprocessor (not shown) and a learning data selector (not shown) to improve the analysis result of a recognition model or reduce resources or time for generating a recognition model.

The training data preprocessor may pre-process an obtained operating state so that the obtained operating state may be used for training for recognizing estimated noise information. For example, the training data preprocessor may process an obtained operating state in a preset format so that the model training unit 24 may use obtained training data for training for recognizing estimated noise information.

Furthermore, the training data selection unit may select data for training among training data obtained by the learning data acquisition unit 23 or training data pre-processed by the preprocessor. The selected training data may be provided to the model training unit 24. For example, the training data selection unit may select only data for a syllable, included in a specific region, as training data by detecting the specific region in the feature values of an operating state obtained by the speech providing device 10.

Further, the data learning unit 22 may further include a model estimator (not shown) to improve the analysis result of a neural network model.

The model estimator inputs estimation data to a neural network model, and when an analysis result output from the estimation data does not satisfy a predetermined reference, it can make the model learning unit 22 perform learning again. In this case, the estimation data may be data defined in advance for estimating a recognition model. For example, when the number or ratio of estimation data with an incorrect analysis result of the analysis result of a recognition model learned with respect to estimation data exceeds a predetermined threshold, the model estimator can estimate that a predetermined reference is not satisfied.

The communication unit 27 can transmit the AI processing result by the AI processor 21 to an external electronic device.

Here, the external electronic device may be defined as an autonomous vehicle. Further, the AI device 20 may be defined as another vehicle or a 5G network that communicates with the autonomous vehicle. Meanwhile, the AI device 20 may be implemented by being functionally embedded in an autonomous module included in a vehicle. Further, the 5G network may include a server or a module that performs control related to autonomous driving.

Meanwhile, the AI device 20 shown in FIG. 5 was functionally separately described into the AI processor 21, the memory 25, the communication unit 27, etc., but it should be noted that the aforementioned components may be integrated in one module and referred to as an AI module.

FIG. 6 illustrates a home appliance control apparatus according to an embodiment of the present invention.

Referring to FIG. 6, the terminal 10 is shown as an example of a home appliance control apparatus. The terminal 10 includes a wireless communication unit 110, an input unit 120, a sensing unit 140, an output unit 150, an interface unit 160, a memory 170, a processor 180 and a power supply unit 190. The components shown in FIG. 6 are not essential for implementing the terminal, and the terminal described in this disclosure may have greater or fewer components than those listed above.

Specifically, the wireless communication unit 110 may include one or more modules enabling wireless communication between the terminal 10 and a wireless communication system, between the terminal 10 and another terminal 10, and between the terminal 10 and an external server. Further, the wireless communication unit 110 may include one or more modules which connect the terminal 10 to one or more networks.

The wireless communication unit 110 may include at least one of a broadcast receiving module 111, a mobile communication module 112, a wireless Internet module 113, a short-range communication module 114, and a location information module 115.

The input unit 120 may include a camera 121 or an image input unit for inputting an image signal, a microphone 122 for inputting an audio signal, an audio input unit, a user input unit 123 (e.g., a touch key, a mechanical key, etc.) for receiving information from a user. Voice data or image data collected by the input unit 120 may be analyzed and processed as a control command of a user.

The sensing unit 140 may include at least one sensor for sensing at least one of information in the terminal, surrounding environment information of the terminal, and user information. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared sensor, a finger scan sensor, an ultrasonic sensor, an optical sensor (e.g., camera 121), a microphone 122, a battery gauge, an environmental sensor (e.g., a barometer, a hygrometer, a thermometer, a radiation detection sensor, a thermal sensor, a gas sensor, etc.), a chemical sensor (e.g., an electronic nose, a healthcare sensor, a biometric sensor, etc.). Meanwhile, the terminal disclosed in the present disclosure may combine and utilize information sensed by at least two of the sensors.

The output unit 150 serves to generate an output related to visual, auditory or tactile sense and includes at least one of a display unit 151, an audio output unit 152, a haptic module 153, and a light output unit 154. The display unit 151 may have an inter-layer structure with a touch sensor or may be integrally formed to realize a touch screen. The touch screen may serve as a user input unit 123 that provides an input interface between the terminal 10 and a user, and provide an output interface between the terminal 10 and the user.

The interface unit 160 serves as an interface with various types of external devices that are connected to the terminal 10. The interface unit 160 may include at least one of wired/wireless headset ports, external power supply ports, wired/wireless data ports, memory card ports, ports for connecting a device having an identification module, audio input/output (I/O) ports, video I/O ports, and earphone ports. When an external device is connected to the interface unit 160, the terminal 10 may perform appropriate control in relation to the connected external device.

The memory 170 stores data supporting various functions of the terminal 10. The memory 170 may store a plurality of application programs or applications that are driven in the terminal 10, data for operation of the terminal 10, and commands. At least some of these applications may be downloaded from an external server via wireless communication. At least some of these application programs may exist on the terminal 10 when the terminal 10 was released from the factory for basic functions (e.g., call incoming and call outgoing function, message reception and message sending function) of the terminal 10. Meanwhile, the application programs may be stored in the memory 170, installed on the terminal 10, and may be driven by the processor 180 to perform an operation (or function) of the terminal.

In addition to the operations related to the application programs, the processor 180 typically controls an overall operation of the terminal 10. The processor 180 may process signals, data, information, and the like, input or output through the components described above or may drive an application program stored in the memory 170 to provide or process appropriate information or functions to the user.

The processor 180 may control at least some of the components shown in FIG. 6 to drive an application program stored in the memory 170. In addition, in order to drive the application program, the processor 180 may operate at least two of the components included in the terminal 10 in combination with each other.

The power supply unit 690 supplies power to the components included in the terminal 10 under the control of the processor 180 upon receiving external power and internal power. The power supply unit 190 may include a battery, and the battery may be an internal battery or a replaceable battery.

At least some of the components may operate in cooperation with each other to implement an operation, control, or a control method of the terminal according to various embodiments described below. In addition, the operation, control, or control method of the terminal may be implemented on the terminal by driving at least one application program stored in the memory 170.

Hereinafter, the components listed above will be described in more detail with reference to FIG. 6 before explaining various embodiments implemented through the terminal 10 as described above.

First, referring to the wireless communication unit 110, the broadcast receiving module 111 of the wireless communication unit 110 receives broadcast signals and/or broadcast-related information from an external broadcast management server through a broadcast channel. The broadcast channel may include a satellite channel and a terrestrial channel. Two or more broadcast receiving modules may be provided to the terminal 10 for simultaneous broadcast reception or broadcast channel switching for at least two broadcast channels.

The mobile communication module 112 may transmit and receive a wireless signal to and from at least one of a base station, an external terminal, and a server in a mobile communication network established according to technical standards or communication scheme for mobile communication (e.g., GSM (Global System for Mobile communication), CDMA (Code Division Multi Access), CDMA2000 (Code Division Multi Access 2000), EV-DO (Enhanced Voice-Data Optimized or Enhanced Voice-Data Only), WCDMA (Wideband CDMA), HSDPA (High Speed Downlink Packet Access), HSUPA (High Speed Uplink Packet Access), LTE (Long Term Evolution), LTE-A (Long Term Evolution-Advanced), etc.

The wireless signal may include various types of data according to transmission/reception of a voice call signal, a video call signal, or a text/multimedia message.

The wireless Internet module 113 is a module for wireless Internet access, and may be provided within or outside the terminal 10. The wireless Internet module 113 is configured to transmit and receive a wireless signal in a communication network according to wireless Internet technologies.

Examples of the wireless Internet technologies include a WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), HSDPA (High Speed Downlink Packet Access), HSUPA (High Speed Uplink Packet Access), LTE (Long Term Evolution), LTE-A (Long Term Evolution-Advanced), and the wireless Internet module 113 transmits and receives data according to at least one wireless Internet technology in a range including Internet technologies not listed above.

From a viewpoint that wireless Internet access by WiBro, HSDPA, HSUPA, GSM, CDMA, WCDMA, LTE and LTE-A is performed through a mobile communication network, the wireless Internet module 113 performing wireless Internet access through the mobile communication network may be understood as a kind of the mobile communication module 112.

The short-range communication module 114 is for short-range communication and may support short-range communication using at least one of Bluetooth®, an RFID (Radio Frequency Identification), an Infrared Data Association (IrDA), UWB (Ultra Wideband), ZigBee, NFC (Near Field Communication), Wi-Fi (Wireless-Fidelity), Wi-Fi Direct, Wireless USB (Wireless Universal Serial Bus). The short-range communication module 114 may support wireless communication between the terminal 10 and a wireless communication system, between the terminal 10 and another terminal 10, or between the terminal 10 and a network where another terminal 100 (or external server) is positioned through a wireless area network. The short-range wireless communication network may be a wireless personal area network.

Here, the other terminal 10 may be a wearable device (e.g., smartwatch, smart glass, head mounted display (HMD), etc.) capable of exchanging data with the terminal 10 according to the present invention. The short-range communication module 114 may detect (or recognize) a wearable device capable of communicating with the terminal 10 around the terminal 10. Further, if the detected wearable device is a device authenticated to communicate with the terminal 10 according to the present invention.

If the detected wearable device is a device authenticated to communicate with the terminal 10 according to the present invention, the processor 180 may transmit at least a part of data processed in the terminal 10 to the wearable device through a local communication module 114. Therefore, a user of the wearable device may use the data processed in the terminal 10 through the wearable device. For example, when a call is received in the terminal 10, the user may perform call communication through the wearable device, or when a message is received by the terminal 10, the user may read the received message via the wearable device.

The location information module 115 is a module for obtaining a location (or current location) of the terminal, and a typical example thereof is a global positioning system (GPS) module or a wireless fidelity (Wi-Fi) module. For example, when the terminal utilizes a GPS module, the terminal may obtain a location of the terminal using signals transmitted from GPS satellites. As another example, when the terminal utilizes the Wi-Fi module, the terminal may obtain the location of the terminal on the basis of information of a wireless access point (AP) that transmits or receives a wireless signal to or from the Wi-Fi module. If necessary, the location information module 115 may perform any of the other functions of the wireless communication unit 110 to substitutively or additionally obtain data regarding a location of the terminal. The location information module 115 is a module used to obtain the location (or the current location) of the terminal, and is not limited to the module that directly calculates or obtains the location of the terminal.

The input unit 120, which is for inputting image information (or signal), audio information (or signal), data, or information input from a user, may include one or a plurality of cameras 121 to input image information. The camera 121 processes image frames of a still image or a moving image obtained by the image sensor in a video communication mode or an image capturing mode. The processed image frame may be displayed on the display unit 151 or stored in the memory 170. The plurality of cameras 121 provided in the terminal 10 may be arranged to form a matrix structure and a plurality of pieces of image information having a variety of angles or foci may be input to the terminal 10. In addition, the plurality of cameras 121 may be arranged in a stereo structure to obtain a left image and a right image for realizing a stereoscopic image.

The microphone 122 processes an external acoustic signal to electrical voice data. The processed voice data may be utilized variously according to a function (or an executed application program) being executed in the terminal 10. Meanwhile, the microphone 122 may include various noise canceling algorithms for canceling noise generated in the process of receiving an external sound signal.

The user input unit 123 is a component for receiving information from the user. When information is input through the user input unit, the processor 180 may control an operation of the terminal 10 to correspond to the input information. The user input unit 123 may include a mechanical input unit (or a mechanical key, for example, a button located on the front, rear, or side of the terminal 10, a dome switch, a jog wheel, jog switch, etc.) and touch-type input unit. For example, the touch-type input unit may be configured as a virtual key, a soft key, or a visual key displayed on a touch screen through software processing or configured as a touch key disposed on a portion other than the touch screen. Meanwhile, the virtual key or the visual key may have various forms and may be displayed on the touch screen and may be configured as, for example, graphic, text, an icon, video, or a combination thereof.

The sensing unit 140 senses at least one of internal information of the terminal, surrounding environment information of the terminal, and user information, and generates a corresponding sensing signal. The processor 180 may control driving or operation of the terminal 10 or may perform data processing, function or operation related to an application program installed in the terminal 10 on the basis of the sensing signal. Typical sensors among various sensors that may be included in the sensing unit 140 will be described in more detail.

First, the proximity sensor 141 refers to a sensor that detects the presence of an object approaching a predetermined detection surface or the presence of an object in the vicinity of the detection surface using an electromagnetic force or an infrared ray, without mechanical contact. The proximity sensor 141 may be disposed in an inner region of the terminal which is covered by the touch screen or in proximity to the touch screen.

Examples of the proximity sensor 141 include a transmission type photoelectric sensor, a direct reflection type photoelectric sensor, a mirror reflection type photoelectric sensor, a high-frequency oscillation type proximity sensor, a capacitive proximity sensor, a magnetic proximity sensor, and an infrared proximity sensor. In a case where the touch screen is a capacitive touch screen, the proximity sensor 141 may be configured to detect proximity of the object by a change in an electric field according to the proximity of the object having conductivity. In this case, the touch screen (or touch sensor) itself may be classified as a proximity sensor.

Meanwhile, for the sake of convenience of description, an action in which an object approaches the touch screen without contacting the touch screen may be called a proximity touch, and an action in which an object actually touches the touch screen may be called a contact touch. A location of the touch screen proximity-touched by the object may refer to a position of the object that vertically opposes the touch screen when the object performs the proximity touch. The proximity sensor 141 may detect a proximity touch and a proximity touch pattern (e.g., a proximity touch distance, a proximity touch direction, a proximity touch duration, a proximity touch position, a proximity touch shift state, etc.). The processor 180 may process data (or information) corresponding to the proximity touch action detected through the proximity sensor 141 and the detected proximity touch pattern and output visual information corresponding to the processed data to the touch screen. Further, the processor 180 may control the terminal 10 to process different operations or data (or information) depending on whether the touch applied to the same point on the touch screen is a proximity touch or a contact touch.

The touch sensor senses a touch (or touch input) applied to the touch screen (or the display unit 151) using at least one of various touch methods such as a resistive type, a capacitive type, an infrared type, an ultrasonic type, and a magnetic field type.

As an example, the touch sensor may be configured to convert pressure applied to a specific portion of the touch screen or a change in capacitance generated in a specific portion into an electrical input signal. The touch sensor may be configured to detect a position at which a touch object applying a touch to the touch screen touches on the touch sensor, an area, a pressure at the time of touch, a capacitance at the time of touch, and the like. Here, the touch object may be a finger, a touch pen, a stylus pen, a pointer, or the like as an object which applies a touch to the touch sensor.

Thus, when there is a touch input to the touch sensor, a corresponding signal(s) is sent to a touch controller. The touch controller processes the signal(s) and then transmits corresponding data to the processor 180. Thus, the processor 180 may know which area of the display unit 151 is touched or the like. Here, the touch controller may be a separate component from the processor 180 or may be the processor 180 itself.

Meanwhile, the processor 180 may perform different controls or perform the same control according to the type of the touch object which touches the touch screen (or a touch key provided on the touch screen). Whether to perform different controls or to perform the same control depending on the type of the touch object may be determined according to a current operation state of the terminal 10 or an application program being executed.

Meanwhile, the touch sensor and the proximity sensor described above may be used independently or in combination to sense various types of touches such as a short touch (or tap), a long touch, a multi-touch, a drag touch, a flick touch, a pinch-in touch, a pinch-out touch, a swipe touch, a hovering touch, and the like.

The ultrasonic sensor may recognize position information of the object to be sensed using ultrasonic waves. Meanwhile, the processor 180 may calculate a position of a wave generating source through information sensed by an optical sensor and the plurality of ultrasonic sensors. The position of the wave generating source may be calculated using the fact that light is much faster than the ultrasonic wave, that is, a time when light reaches the optical sensor is much faster than a time when the ultrasonic wave reaches the ultrasonic sensor. More specifically, the position of the wave generating source may be calculated using a time difference with the time when the ultrasonic wave reaches based on light as a reference signal.

A posture detection sensor may sense posture information such as movement information such as presence or absence of movement, distance, speed, acceleration, and direction of the terminal and/or an angle at which the terminal 10 is inclined with respect to a predetermined rotation axis.

The posture detection sensor 143 may include at least one acceleration sensor 144, at least one gyroscope 143, or a sensing signal processing unit (not shown) for compensating for a sensing value or converting sensing information.

The posture detection sensor may obtain linear movement, rotational movement, shaking information, and the like of the terminal 10 on the basis of acceleration sensed through various sensors. The acceleration sensor 144 senses movement of the terminal 10, obtains acceleration thereof, and detects information about the presence or absence of movement, distance, speed, acceleration, and direction of the terminal 10.

Also, the gyro sensor 143 may sense rotation of the terminal 10 and obtain the amount of rotation. The acceleration sensor 143 may express the sensed acceleration as vector values for three axes (X axis, Y axis, Z axis), and the gyroscope may express the sensed acceleration as rotation vector values (roll, pitch, and yaw) with respect to the three axes. Including the acceleration sensor 144 and the gyro sensor 143, the posture detection sensor may recognize a speed, position, and position change of the terminal 10. The posture detection sensor may be a general inertial navigation system (INS), and the gyro sensor may be a gyroscope such as an optical, mechanical, or piezoelectric type.

The sensing signal processing unit (not shown) may convert an analog signal output from the acceleration sensor or the gyroscope into an analog/digital signal, integrates the converted signal, and tracks a trace to convert into movement information, angle information, shaking information or the like.

In the above, the posture detection sensor including the acceleration sensor 144 and the gyro sensor 143 to obtain the posture and the movement of the terminal 10 According to an embodiment of the present invention is described but the present invention is not limited thereto and movement and posture information of the terminal 10 may be obtained using a certain sensor within the scope in which the object of the present invention may be achieved.

The camera 121 described as a component of the input unit 120 includes at least one of a camera sensor (e.g., a CCD, a CMOS, etc.), a photo sensor (or an image sensor), and a laser sensor.

The camera 121 and the laser sensor may be combined with each other to sense a touch of the sensing object with respect to a three-dimensional stereoscopic image. A photosensor may be stacked on a display element and may be configured to scan movement of the sensing object proximate to the touch screen. More specifically, the photosensor includes photo diodes and transistors (TRs) in a row/column and scans contents placed on the photosensor using an electrical signal changing according to the amount of light applied to the photo diode. That is, the photo sensor performs coordinate calculation of the sensing object according to variation of light, and position information of the sensing object may be obtained through the calculation.

The display unit 151 displays (outputs) information processed in the terminal 10. For example, the display unit 151 may display execution screen information of an application program driven in the terminal 10 or a user interface (UI) or graphic user interface (GUI) information according to the execution screen information.

In addition, the display unit 151 may be configured as a stereoscopic display unit for displaying a stereoscopic image.

The stereoscopic display unit may adopt a three-dimensional display method such as a stereoscopic method (glass method), an autostereoscopic method (glassless method), and a projection method (holographic method).

The audio output unit 152 may output audio data received from the wireless communication unit 110 or stored in the memory 170 in a call signal reception mode, a call mode or a recording mode, a voice recognition mode, and a broadcast reception mode. The audio output unit 152 may also output an audio signal related to a function (e.g., call signal reception sound, message reception sound, etc.) performed in the terminal 10. The audio output unit 152 may include a receiver, a speaker, a buzzer, and the like.

The haptic module 153 generates various tactile effects that the user may feel. A typical example of the haptic effect generated by the haptic module 153 may be vibration. The intensity and pattern of the vibration generated in the haptic module 153 may be controlled by the user's selection or a setting of the processor. For example, the haptic module 153 may synthesize different vibrations and output the same or sequentially output the vibrations.

In addition to vibration, the haptic module 153 may generate various other tactile effects, including an effect by stimulation such as a pin arrangement vertically moving to a contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 may also be implemented to allow the user to feel a tactile effect through a muscle sensation such as the user's fingers or arm, as well as transferring the tactile effect through direct contact. Two or more haptic modules 153 may be provided according to a particular configuration of the terminal.

The light output unit 154 outputs a signal for notifying the occurrence of an event using light of a light source of the terminal 10. Examples of events that occur in the terminal 10 may include message reception, call signal reception, an absent call, alarm, schedule notification, e-mail reception, information reception through an application, and the like.

The signal output by the light output unit 154 is implemented when the terminal emits light of a single color or a plurality of colors to the front or rear surface. The signal output may be terminated as the terminal detects that the user checks the event.

The interface unit 160 serves as an interface for communication with all external devices connected to the terminal 10. The interface unit 160 receives data or power from an external device and transmits the data to each component in the terminal 10 or allows data in the terminal 10 to be transmitted to an external device. For example, a wired/wireless headset port, an external charger port, a wired/wireless data port, a memory card port, a port connecting a device having an identification module, an audio input/output (I/O) port, a video I/O port, an earphone port, and the like may be included in the interface unit 160.

Meanwhile, the identification module may include a user identification module (UIM), a subscriber identity module (SIM), a universal subscriber identity module (USIM), and the like, as a chip storing various information for authenticating authority to use the terminal 10. A device including the identification module (hereinafter referred to as "identification device") may be manufactured in a smart card form. Accordingly, the identification device may be connected to the terminal 100 through the interface unit 160.

When the terminal 10 is connected with an external cradle, the interface unit 160 may serve as an interface to allow power from the cradle to be supplied to the terminal 10 or may serve as an interface to allow various command signals input by the user from the cradle to be transferred to the terminal 10 therethrough. Various command signals or power input from the cradle may operate as signals for recognizing that the terminal 10 is properly mounted on the cradle.

The memory 170 may store a program for the operation of the processor 180 and temporarily store input/output data (e.g., a phone book, a message, a still image, a moving picture, etc.). The memory 170 may store data related to vibration and sound of various patterns output when a touch is input on the touch screen.

The memory 170 may include at least one of a flash memory type, a hard disk type, a solid state disk type, a silicon disk drive (SDD) type, a multimedia card micro type, a card type memory (e.g., SD or XD memory, etc.), a random access memory (RAM), static random access memory (SRAM), read-only memory (ROM), an electrically erasable programmable read-only memory (EEPROM), programmable read-only memory (PROM), magnetic memory, magnetic disk, and optical disk. The terminal 10 may be operated in association with a web storage that performs a storage function of the memory 170 on the internet.

Meanwhile, as described above, the processor 180 controls an operation related to an application program and an overall operation of the terminal 10. For example, the processor 180 may execute or release a lock state that restricts input of a user's control command for applications if a state of the terminal meets a set condition.

In addition, the processor 180 may perform control and processing related to a voice call, data communication, video call, and the like, or perform pattern recognition that recognizes handwriting input or drawing input performed on the touch screen as characters and images. Further, the processor 180 may control any one or a combination of a plurality of the above-described components in order to implement various embodiments described below on the terminal 10 according to the present invention.

The power supply unit 190 receives external power and internal power and supplies power required for an operation of each component under the control of the processor 180. The power supply unit 190 includes a battery, the battery may be an internal battery configured to be chargeable or may be detachably coupled to the terminal body for charging or the like.

In addition, the power supply unit 190 may include a connection port, and the connection port may be configured as an example of the interface 160 in which an external charger for supplying power is electrically connected to charge the battery As another example, the power supply unit 190 may be configured to charge the battery in a wireless manner without using the connection port. In this case, the power supply unit 190 may receive power using at least one of an inductive coupling method based on a magnetic induction phenomenon from an external wireless power transmission device and a magnetic resonance coupling method based on an electromagnetic resonance phenomenon.

Meanwhile, hereinafter, various embodiments may be implemented in a recording medium readable by a computer or similar device using, for example, software, hardware, or a combination thereof.

Meanwhile, the terminal 10 may transmit data requiring AI processing to the AI device 20 through the communication unit, and the AI device 20 including the deep learning model 26 may transmit an AI processing result using the deep learning model 26 to the terminal 10. The AI device 20 may refer to the contents described above with reference to FIG. 5.

The processor 180 may further include an AI processor 261.

Hereinafter, other electronic devices and the AI processor 261 connected to the interface unit will be described in detail.

Meanwhile, the terminal 10 may transmit information received from each smart plug to the AI device 20 through the wireless communication unit 110, and the AI device 20 may transmit AI processing data generated by applying a neural network model 26 to the received data to the terminal 10. The terminal 10 may determine an optimal usage setting on the basis of the received AI processing data and control power of each home appliance using the optimal usage setting.

The wireless communication unit 110 may exchange signals with a device located outside the terminal 10. The wireless communication unit 110 may exchange signals with at least one of an infrastructure (e.g., a server, a broadcasting station), an IoT device, and another terminal. The wireless communication unit 110 may include at least one of a transmission antenna, a reception antenna, a radio frequency (RF) circuit capable of implementing various communication protocols, and an RF element for performing communication.

Meanwhile, the AI processor 261 may generate information related to an optimal usage setting at home using power usage data of each home appliance sensed by each smart plug.

According to an embodiment of the present invention, the wireless communication unit 110 may obtain power usage history data of each home appliance from each smart plug.

The wireless communication unit 110 may transmit the obtained power usage history data of each home appliance to the processor 180.

According to an embodiment of the present invention, the processor 180 may determine an optimal usage setting for controlling power of each home appliance using the power usage history data for each of the plurality of home appliances transmitted from the wireless communication unit 110.

The processor 180 may transfer the power usage history data of each home appliance to the deep learning model 26 of the AI processor 20 or the AI processor 261 of the processor 180 through the wireless communication unit 110. The processor 180 may then obtain optimal usage setting information determined by the deep running model 26 of the AI device 20 or the AI processor 261 in the processor 180 via the wireless communication unit 110 and control electric power provided to each home appliance using the optimal usage setting information.

Hereinabove, the 5G communication required for implementing the home appliance control method and the schematic contents of performing AI processing by applying the 5G communication and transmitting and receiving AI processing results according to an embodiment of the present invention have been described.

Hereinafter, a specific method of controlling each home appliance on the basis of power usage history data of each home appliance according to an embodiment of the present invention will be described with reference to necessary drawings.

FIG. 7 is a flowchart of a home appliance control method according to an embodiment of the present invention.

As shown in FIG. 7, the terminal 10 (or a home appliance control apparatus) may perform a home appliance control method S700 of FIG. 7, and a detailed description will be given below.

First, the terminal 10 may obtain power usage history of a plurality of home appliances wiredly connected to outlets (S710).

Here, the outlets may refer to the smart plugs or IoT outlets described above. The outlets may provide external power to the home appliance connected thereto, respectively.

For example, the terminal 10 may perform wired/wireless communication with the smart plugs. Here, the terminal 10 may obtain power usage data of the plurality of home appliances wiredly connected to the smart plugs through wired/wireless communication with the smart plugs. In detail, the terminal 10 may obtain the power usage history of each of the plurality of home appliances connected to the smart plugs in units of seconds, minutes, hours, days, weeks, months, or years.

Next, the terminal 10 may determine an optimal usage setting on the basis of the power usage history of the plurality of home appliances (S730).

Here, the optimal usage setting may refer to, for example, a usage pattern setting for each home appliance that may minimize the amount of usage of the total amount of power used in the home appliance system 100. In another example, the optimal usage setting may mean a usage pattern setting for each home appliance that may minimize usage of a total electric energy used in each home appliance.

Lastly, the terminal 10 may control power of each home appliance on the basis of the optimal usage setting (S750).

Here, the terminal 10 may control power of each home appliance connected to the smart plug by sending a power control signal for each home appliance to the smart plug connected for wired/wireless communication.

For example, the terminal 10 may control the use of electric power of each home appliance connected to the smart plug by allowing each home appliance to be used according to the optimal usage setting.

FIG. 8 is a flowchart illustrating power usage history obtaining step of FIG. 7 in detail.

As shown in FIG. 8, the terminal 10 may divide usage histories of the respective home appliances obtained through the smart plugs by timeslot (S711).

For example, as described above, the terminal 10 may divide usage history of each home appliance obtained through the smart plug in units of seconds, minutes, hours, days, weeks, months, or years. In another example, the terminal 10 may divide a plurality of home appliance use histories obtained through the smart plugs by home appliances.

Subsequently, the terminal 10 may generate a usage history of the plurality of home appliances by timeslot (S713).

For example, the terminal 10 may divide usage histories of the home appliances by timeslot and subsequently generate usage histories of the plurality of home appliances for each timeslot. Here, the terminal 10 may generate usage histories of the plurality of home appliance by timeslot and store the generated usage histories of the plurality of home appliances in the memory.

FIG. 9 is a flowchart illustrating an optimal usage setting determination step of FIG. 7 in detail.

As shown in FIG. 9, first, the terminal 10 may first generate usage pattern information of each home appliance on the basis of usage history information of each timeslot (S731).

Here, the terminal 10 may generate usage pattern information of each home appliance in units of seconds, minutes, hours, days, weeks, months, or years on the basis of the usage history information of each home appliance in units of seconds, minutes, hours, days, weeks, months, or years.

Then, the terminal 10 may display usage pattern information of each home appliance on the display 151 (S733).

That is, the terminal 10 may display the generated usage pattern information of each home appliance on the display 151, thereby allowing the user to check the usage pattern information of each home appliance in units of seconds, minutes, hours, days, weeks, months, and years.

Lastly, the terminal 10 may determine an optimal usage setting of each home appliance using the usage pattern information (S735).

FIG. 10 shows an example of displaying usage pattern information of each home appliance.

As shown in FIG. 10, the terminal 10 may display usage pattern information 1000 of a plurality of home appliances through the display 151.

For example, the terminal 10 may display usage pattern information 1010 of a hair dryer, usage pattern information 1020 of a fan, usage pattern information 1030 of an electric rice cooker, usage pattern information 1040 of a washing machine, usage pattern information 1050 of an outlet, and usage pattern information 1060 of an LED desk lamp on a current time basis (e.g., the last 1 second) through the display 151.

Specifically, the terminal 10 may display location information 1011 of the hair dryer, a name 1012 of the hair dryer, an online/offline status 1013, and an icon 1014 of the hair dryer included in the usage pattern information 1010.

FIG. 11 is a flowchart of an example of performing a step of determining an optimal usage setting of FIG. 9 through AI processing.

As shown in FIG. 11, the terminal 10 may extract a feature value from a plurality of pieces of home appliance usage pattern information (S7351).

For example, the terminal 10 may extract a feature value from power usage of each home appliance included in the plurality of pieces of home appliance usage pattern information by timeslot.

Thereafter, the terminal 10 may input the extracted feature value to a previously learned artificial neural network (ANN) (S7352).

Here, the artificial neural network may be learned in advance so as to receive a feature value extracted from the usage pattern information of each home appliance as an input and generate optimal usage information for each home appliance as an output.

Thereafter, the terminal 10 may analyze an output value of the artificial neural network (S7353).

Lastly, the terminal 10 may determine an optimal usage setting for each home appliance, for the purpose of using optimal power for each home appliance using the output value of the artificial neural network (S7354).

FIG. 12 is a flowchart of an example of determining the step of determining an optimal usage setting of FIG. 9 through AI processing of a 5G network.

As illustrated in FIG. 12, the terminal 10 (UE) (smartphone) may transmit a feature value extracted from usage pattern information of a plurality of home appliances to an AI processor included in a 5G network through the wireless communication unit 110. In addition, the terminal 10 may control the wireless communication unit to receive AI-processed information from the AI processor.

The AI-processed information may be information related to an optimal usage setting for minimizing power usage for each home appliance.

Meanwhile, the terminal 10 may perform the initial access procedure with the 5G network in order to transmit the feature value of the usage pattern information of each home appliance to the 5G network. The terminal 10 may perform the initial access procedure with the 5G network on the basis of a synchronization signal block (SSB).

Also, the terminal 10 may receive downlink control information (DCI) used for scheduling transmission of the feature value of the usage pattern information of each home appliance from the network through the wireless communication unit.

The processor 180 may transmit the feature value of the usage pattern information of each home appliance to the network on the basis of the DCI.

The feature value of the usage pattern information of each home appliance may be transmitted to the network through a PUSCH, and the SSB and a DM-RS of the PUSCH may be quasi-co-located, QCL, for a QCL type D.

Here, the 5G network may include an AI processor or an AI system, and the AI system of the 5G network may perform AI processing on the basis of the received feature value of the usage pattern information of each home appliance (S1210).

Specifically, the AI system may input the feature values received from the terminal 10 to the ANN classifier (S1211). The AI system may analyze the ANN output value (S1213) and determine information related to the optimal usage setting for each home appliance from the ANN output value (S1215).

The 5G network may transmit optimal usage setting information for each home appliance determined by the AI system to the terminal 10 through the wireless communication unit.

Meanwhile, the terminal 10 may transmit only the usage pattern information for each home appliance to the 5G network, and extract a feature value corresponding to the usage pattern information for each home appliance to be used as an input of the artificial neural network for determining an optimal usage setting for each home appliance from the usage pattern information for each home appliance in the AI system included in the 5G network.

FIG. 13 shows an example of displaying an optimal usage setting.

As shown in FIG. 13, the terminal 10 may determine an optimal usage setting for each home appliance and display the determined optimal usage setting for each home appliance through the display 151.

For example, the terminal 10 may display an optimal usage setting 1300 of the hair dryer on the display 151 as shown in FIG. 13.

Specifically, the terminal 10 may display a name 1310 of the hair dryer, the latest usage pattern 1320 ("operation state: operating (ON)" (1321)) of a preset time (e.g., 1 second), power usage 1330 for a preset period of time ("power usage: 105 W (1331)), a cumulative usage 1340 ("cumulative usage: 1.25 KWh (1341), and the determined optimal usage setting 1350 as an optimal usage setting 1300 of the hair dryer.

Specifically, regarding the optimal usage setting 1350, the terminal 10 may display a tab 1351 indicating an optimal usage setting status, an optimal usage setting ("main usage time: 07:30-07:45/Saturday: 09:50-10:08/Sunday: 10:30-10: 43/Total usage time per day: 15 minutes on average")(1352).

FIG. 14 shows a home appliance system according to another embodiment of the present invention.

As shown in FIG. 14, a home appliance system 11400 according to another embodiment of the present invention is different from the home appliance system 100 of FIG. 4 in that a server 1410, instead of the terminal 10, is used and performs an operation according to the home appliance control method of the terminal 10.

For example, the server 1410 in FIG. 14 may be a cloud server. As another example, the server 1410 in FIG. 14 may be a home IoT server.

The server 1410 shown in FIG. 14 may perform wired/wireless communication with a plurality of smart plugs 1440 wiredly connected to a plurality of home appliances 1430. The server 1410 may obtain power usage of each of the home appliances 1431, 1432, 1433, 1434 by timeslot from each of smart plugs 1441, 1442, 1443, and 1444 connected to each of the home appliances.

The server 1410 may generate usage pattern information of each home appliance by timeslot using the obtained power usage data for each home appliance.

Subsequently, the server 1410 may generate an optimal usage pattern for each home appliance by timeslot using the usage pattern information for each home appliance by timeslot.

The above-described present invention can be implemented as a computer-readable code on a medium on which a program is recorded. The computer readable medium includes all kinds of recording devices in which data that can be read by a computer system is stored. Examples of the computer readable medium may include a hard disk drive (HDD), a solid state disk (SSD), a silicon disk drive (SDD), a ROM, a RAM, a CD-ROM, a magnetic tape, a floppy disk, an optical data storage device, and the like, or be implemented in the form of a carrier wave (e.g., transmission over the internet). Accordingly, the above detailed description should not be construed in all aspects as limiting, and be considered illustrative. The scope of the present invention should be determined by rational interpretation of the appended claims, and all changes within the equivalent range of the present invention are included in the scope of the present invention.

The effects of the intelligent home appliance control method, the device for controlling the home appliance, and the intelligent computing device according to an embodiment of the present invention will be described below.

The present invention provides an intelligent home appliance control method for optimal power usage by collecting usage history of a home appliance of a user by timeslot and analyzing usage patterns of various home appliances, thereby minimizing power usage required for a plurality of home appliances at home.

Furthermore, the present invention can support an optimal usage setting by analyzing usage patterns of home appliances without IoT communication equipment.

Furthermore, the present invention can automatically provide user convenience for home appliances by automatically providing a power-off function and a usage time management function, which were manually provided in the existing technology, through the home appliance control apparatus and the intelligent computing device.

What is claimed is:

1. An intelligent method for controlling a home appliance, the method comprising:
   obtaining, from a plug, power usage data of a device receiving power from the plug;
   generating information related to an optimal usage setting for the device based on the power usage data of the device; and
   controlling power provided to the device through the plug based on the information related to the optimal usage setting,
   wherein the obtaining of the power usage data of the device comprises:
      generating usage pattern information of the device based on the power usage data of the device; and
      displaying the usage pattern information of the device on a display.

2. The method of claim 1, wherein
   the obtaining of the power usage data of the device comprises:
   dividing power usage of the device by timeslot; and
   generating a power usage history of the device by timeslot.

3. The method of claim 2, wherein
   the power usage history of each device by timeslot comprises information related to power usage history of the device in units of seconds, minutes, hours, days, weeks, months, or years.

4. The method of claim 1, wherein
   the usage pattern information of the device comprises at least one of a name of the device, a latest use state of the device, and a position of the device.

5. The method of claim 1, wherein
   the generating of the information related to the optimal usage setting for the device comprises displaying information related to the optimal usage setting on the display.

6. The method of claim 5, wherein
   the information related to the optimal usage setting comprises at least one of information related to an operation state of the device, power usage of the device for a predetermined period of time, a cumulative usage of the device, and the optimal usage setting of the device.

7. The method of claim 6, wherein
   the information related to the optimal usage setting of the device comprises information related to an optimal usage time of the device by preset timeslot.

8. The method of claim 1, wherein
   the generating of the information related to the optimal usage setting for the device comprises:
   extracting a feature value from the power usage data of the device;
   inputting the feature value into a pre-learned deep learning model; and
   obtaining information related to an optimal usage setting for the device based on an output of the deep learning model.

9. The method of claim 1, further comprising:
   receiving, from a network, a downlink control information (DCI) for scheduling transmission of the power usage data of the device,
   wherein the power usage data of the device is transmitted to the network based on the DCI.

10. The method of claim 9, further comprising:
    performing an initial access procedure with the network based on a synchronization signal block (SSB),
    wherein the power usage data of the device is transmitted to the network through a PUSCH, and the SSB and a DM-RS of the PUSCH are quasi-co-located (QCL), for a QCL type D.

11. The method of claim 10, further comprising:
    controlling a communication unit to transmit the power usage data of the device to an artificial intelligence (AI) processor included in the network; and
    controlling the communication unit to receive AI-processed information from the AI processor,
    wherein the AI-processed information is information related to the optimal usage setting of the device.

12. A home appliance control apparatus for controlling a home appliance, the apparatus comprising:
    a communication unit communicatively connected to a plug;
    a display;
    a processor controlling the communication unit; and
    a memory including a command executable by the processor,
    wherein the command causes the processor to perform operations comprising:
    obtaining, from a plug, power usage data of a device which is provided with power from the plug,
    generating information related to an optimal usage setting for the device based on the power usage data of the device, and
    controlling power provided to the device through the plug based on information related to the optimal usage setting,
    wherein the operations further comprise:
       generating usage pattern information of the device based on the power usage data of the device, and
       displaying the usage pattern information of the device on the display.

13. The apparatus of claim 12, wherein the operations further comprise:
   dividing power usage of the device by timeslot and generating power usage history of the device by timeslot.

14. The apparatus of claim 13, wherein
   the power usage history of each device by timeslot comprises information related to power usage history of the device in units of seconds, minutes, hours, days, weeks, months, or years.

15. The apparatus of claim 12, wherein
   the usage pattern information of the device comprises at least one of a name of the device, a latest use state of the device, and a position of the device.

16. The apparatus of claim 12, wherein
   information related to the optimal usage setting is displayed on the display.

17. The apparatus of claim 16, wherein
   the information related to the optimal usage setting comprises at least one of information related to an operation state of the device, power usage of the device for a predetermined period of time, a cumulative usage of the device, and the optimal usage setting of the device.

18. A non-transitory computer-readable recording medium storing a computer-executable component that, based on being executed in at least one processor of a computing device, perform operations comprising:
   obtaining, from a plug, power usage data of a device provided with power from the plug,
   generating information related to an optimal usage setting for the device based on the power usage data of the device, and
   controlling power supplied to the device through the plug based on information related to the optimal usage setting,
   wherein the operations further comprise:
      generating usage pattern information of the device based on the power usage data of the device, and
      displaying the usage pattern information of the device on a display.

* * * * *